United States Patent
Sang et al.

(10) Patent No.: US 12,400,597 B2
(45) Date of Patent: Aug. 26, 2025

(54) DISPLAY DEVICE AND DRIVING METHOD THEREOF

(71) Applicant: LG Display Co., Ltd., Seoul (KR)

(72) Inventors: Woo Kyu Sang, Paju-si (KR); Moon Soo Chung, Paju-si (KR); Tae Hun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/672,748

(22) Filed: May 23, 2024

(65) Prior Publication Data

US 2025/0118263 A1 Apr. 10, 2025

(30) Foreign Application Priority Data

Oct. 5, 2023 (KR) .................. 10-2023-0132356

(51) Int. Cl.
*G09G 3/3258* (2016.01)
*G09G 3/3266* (2016.01)
*G11C 19/28* (2006.01)

(52) U.S. Cl.
CPC ......... *G09G 3/3258* (2013.01); *G09G 3/3266* (2013.01); *G09G 2300/0819* (2013.01); *G09G 2300/0842* (2013.01); *G09G 2300/0861* (2013.01); *G09G 2310/0286* (2013.01); *G09G 2310/0294* (2013.01); *G09G 2320/0247* (2013.01); *G09G 2330/023* (2013.01); *G11C 19/287* (2013.01)

(58) Field of Classification Search
None
See application file for complete search history.

(56) References Cited

U.S. PATENT DOCUMENTS 10,074,305 B2 9/2018 Choi et al.
2015/0287362 A1 10/2015 Lee et al.
(Continued)

FOREIGN PATENT DOCUMENTS

CN 110767172 A 2/2020
KR 10-2022-0042747 A 4/2022
(Continued)

OTHER PUBLICATIONS

Intellectual Property Office of the United Kingdom, Search Report, United Kingdom Patent Application No. GB2410342.6, Jan. 28, 2025, four pages.
(Continued)

*Primary Examiner* — Christopher J Kohlman
(74) *Attorney, Agent, or Firm* — Fenwick & West LLP

(57) ABSTRACT

Disclosed a display device and a method of driving the same. Each of sub-pixels in the display device includes: a light-emitting element; a driving element; a first switch element; a second switch element; a third switch element; and a fourth switch element. A gate signal includes: a first-first scan signal applied to a gate electrode of the fourth switch element, a first-second scan signal applied to a gate electrode of the third switch element, a second scan signal applied to a gate electrode of the second switch element, and an emission control signal applied to a gate electrode of the first switch element. A pulse of the first-first scan signal has the same pulse width as a pulse of the first-second scan signal and precedes the pulse of the first-second scan signal.

20 Claims, 27 Drawing Sheets

(56) References Cited

U.S. PATENT DOCUMENTS

| | | |
|---|---|---|
| 2017/0061880 A1 | 3/2017 | Choi et al. |
| 2021/0183303 A1 | 6/2021 | Kim et al. |
| 2021/0201759 A1 | 7/2021 | Cho et al. |
| 2023/0140604 A1* | 5/2023 | Jeong .................. G09G 3/3266 345/211 |

FOREIGN PATENT DOCUMENTS

| | | |
|---|---|---|
| KR | 10-2389343 B1 | 4/2022 |
| TW | 201942894 A | 11/2019 |
| TW | 202125483 A | 7/2021 |

OTHER PUBLICATIONS

Taiwan Intellectual Property Office, Office Action, Taiwanese Patent Application No. 113125713, May 2, 2025, 10 pages.

* cited by examiner

DISPLAY DEVICE AND DRIVING METHOD THEREOF

CROSS-REFERENCE TO RELATED APPLICATION

This application claims priority to and the benefit of Republic of Korea Patent Application No. 10-2023-0132356, filed on Oct. 5, 2023, which is hereby incorporated by reference in its entirety.

BACKGROUND

Field

The present disclosure relates to a display device and a method for driving the same, and more particularly, for example, without limitation, to a display device that is capable of reducing the size of a gate driving circuit and improving an image quality in a low-power driving mode, and a method for driving the same.

Description of Related Art

An organic light-emitting display device includes an organic light-emitting diode (hereinafter referred to as "OLED") which emits light by itself and has the advantages of fast response speed and large luminous efficiency, luminance, and viewing angle. The organic light-emitting display device has a fast response speed and excellent luminous efficiency, luminance, and viewing angle, and has an excellent contrast ratio and color reproducibility as the organic light-emitting display device may express black grayscales in full black.

The electrical characteristic of a driving element may vary from pixel to pixel due to process deviations and device characteristic deviations resulting from the panel manufacturing process. The electrical characteristic deviation of the pixels may increase as the driving time of the pixels elapses. To compensate for the electrical characteristic deviation of the driving element for each pixel, a pixel circuit of the organic light-emitting display device may be implemented with an internal compensation circuit. The internal compensation circuit may compensate a gate voltage of the driving element by sampling a threshold voltage of the driving element. The internal compensation circuit requires the addition of transistors to the pixel circuit and requires gate signals to control them, which increases the size of the gate driving circuit disposed on the display panel. This limits narrow bezel designs that reduce a non-display area outside the display device.

Various studies are being conducted to reduce power consumption of the organic light-emitting display device. For example, the organic light-emitting display may lower the driving frequency of the pixels to reduce power consumption under certain conditions. In this case, the viewer may experience, for example, a flicker in the image reproduced on the display panel.

SUMMARY

The present disclosure has been made in an effort to address aforementioned necessities and/or drawbacks.

The present disclosure provides a display device that is capable of reducing the size of a gate driving circuit and improving an image quality in a low-power driving mode, and a method for driving the same.

The problem to be solved by the present disclosure is not limited to those mentioned above, and other problems not mentioned will be clearly understood by those skilled in the art from the following description.

A display device according to an exemplary embodiment of the present disclosure includes: a display panel on which a plurality of data lines, a plurality of gate lines, a plurality of power lines, and a plurality of sub-pixels are disposed; a data driver configured to supply a data voltage to the data lines; and a gate driver configured to supply a gate signals to the gate lines. Each of the sub-pixels includes: a light-emitting element; a driving element including a gate electrode connected to a first node, a first electrode connected to a second node, a second electrode connected to a third node, and configured to drive the light-emitting element; a first switch element configured to supply a pixel driving voltage to the second node; a second switch element configured to supply the data voltage to the second node; a third switch element configured to connect the first node to the third node; and a fourth switch element configured to supply an initialization voltage to the first node. The gate signal includes: a first-first scan signal applied to a gate electrode of the fourth switch element, a first-second scan signal applied to a gate electrode of the third switch element, a second scan signal applied to a gate electrode of the second switch element, and an emission control signal applied to a gate electrode of the first switch element. A pulse of the first-first scan signal has the same pulse width as a pulse of the first-second scan signal and precedes the pulse of the first-second scan signal.

The gate driver may include a first shift register configured to output a pulse of the first-first scan signal, followed by a pulse of the first-second scan signal; a second shift register configured to output a pulse of the second scan signal; and a third shift register configured to output a pulse of the emission control signal.

Each of the sub-pixels may further include a capacitor connected between the pixel driving voltage and the first node.

The first switch element may include a gate electrode to which the emission control signal is applied, a first electrode to which the pixel driving voltage is applied, and a second electrode connected to the second node. The second switch element may include a gate electrode to which the second scan signal is applied, a first electrode connected to the data line, and a second electrode connected to the second node. The third switch element may include a gate electrode to which the first-second scan signal is applied, a first electrode connected to the first node, and a second electrode connected to the third node. The fourth switch element may include a gate electrode to which the first-first scan signal is applied, a first electrode connected to the first node, and a second electrode to which the initialization voltage is applied. The light-emitting element may include an anode electrode connected to the third node and a cathode electrode to which a cathode voltage is applied.

During an initialization period, the third switch element and the fourth switch element may be turned on to apply the initialization voltage to the first and third nodes. During a sampling period, the second switch element and the third switch element may be turned on so that the data voltage is applied to the second node and the first node is electrically connected to the third node. During an emission period, the first switch element may be turned on.

Each of the sub-pixels may further include a fifth switch element configured to supply a second compensation voltage to the second node; a sixth switch element configured to apply a third compensation voltage to a fourth node; and a seventh switch element configured to connect the third node to the fourth node in response to the emission control signal.

The gate signal may further include a third scan signal applied to the gate electrode of each of the fifth and sixth switch elements.

Each of the sub-pixels may further include a first capacitor connected between the pixel driving voltage and the first node. The fifth switch element may include a gate electrode to which the third scan signal is applied, a first electrode connected to the second node, and a second electrode to which the second compensation voltage is applied. The sixth switch element may include a gate electrode to which the third scan signal is applied, a first electrode connected to the fourth node, and a second electrode to which the third compensation voltage is applied. The seventh switch element may include a gate electrode to which the emission control signal is applied, a first electrode connected to the third node, and a second electrode connected to the fourth node. The light-emitting element may include an anode electrode connected to the fourth node and a cathode electrode to which a cathode voltage is applied.

Each of the sub-pixels may further include a second capacitor connected between a gate line, to which the third scan signal is applied, and the first node.

A low power mode may include a refresh frame in which a data voltage is applied to the sub-pixels through the data line, and a hold frame in which a first compensation voltage is applied to the sub-pixels through the data line. The refresh frame may include a first on-bias period, a first initialization period, a second initialization period, a sampling period, a second on-bias period, and an emission period. During the first on-bias period of the refresh frame, the fifth and sixth switch elements may be turned on to apply the second compensation voltage to the second node and the third compensation voltage to the fourth node. During the first initialization period of the refresh frame, the fourth switch element may be turned on to apply the initialization voltage to the first node. During the second initialization period of the refresh frame, the third and fourth switch elements may be turned on to apply the initialization voltage to the first node and the third node. During the sampling period of the refresh frame, the second switch element may be turned on to apply the data voltage to the second node. During the second on-bias period of the refresh frame, the fifth and sixth switch elements may be turned on to apply the second compensation voltage to the second node and the third compensation voltage to the fourth node. During the emission period of the refresh frame, the first and seventh switch elements may be turned on.

The display device may further include a switch element configured to apply the first compensation voltage to the data line during the hold frame. No data voltage may be output from the data driver in the hold frame.

The hold frame may include a third on-bias period, a fourth on-bias period, and an emission period. During each of the third and fourth on-bias periods of the hold frame, the fifth and sixth switch elements may be turned on to apply the second compensation voltage to the second node and the third compensation voltage to the fourth node. The first and seventh switch elements may be turned on during the emission period of the hold frame.

The refresh frame may further include a first floating period between the first on-bias period and the first initialization period, a second floating period between the sampling period and the second on-bias period, and a third floating period between the second on-bias period and the emission period of the refresh frame. The hold frame may further include a fourth floating period between the third on-bias period and the fourth on-bias period, and a fifth floating period between the fourth on-bias period and the emission period of the hold frame. The first to seventh switch elements may be in the off-state in each of the first to fifth floating periods.

The voltage of the second compensation voltage may be less in the refresh frame than in the hold frame.

The gate driver may include a first shift register configured to output a pulse of the first-first scan signal, followed by a pulse of the first-second scan signal; a second shift register configured to output a pulse of the second scan signal; a third shift register configured to output a pulse of the third scan signal; and a fourth shift register configured to output a pulse of the emission control signal.

The second shift register may include a plurality of odd-numbered signal transmission parts configured to sequentially output pulses of odd-numbered scan signals; and a plurality of even-numbered signal transmission part configured to sequentially output pulses of even-numbered scan signals.

A carry signal may be transmitted between the odd-numbered signal transmission parts and the even-numbered signal transmission parts, which are adjacent to each other.

A method of driving a display device according to an exemplary embodiment of the present disclosure includes: supplying a gate signal to a plurality of gate lines connected to a pixel circuit during a refresh frame period and a hold frame period; supplying a data voltage to a plurality of data lines, and supplying the data voltage, a second compensation voltage, and a third compensation voltage to the pixel circuit during the refresh frame period; and supplying a first compensation voltage to the data lines, and supplying the first compensation voltage, the second compensation voltage, and the third compensation voltage to the pixel circuit during the hold frame period. The gate signal includes pulses of a first-first scan signal and a first-second scan signal sequentially output from a first shift register, a pulse of a second scan signal sequentially output from a second shift register, and a pulse of an emission control signal sequentially output from a third shift register. The pulse of the first-first scan signal is generated and then the pulse of the first-second scan signal is generated. The pulse of the first-first scan signal has the same pulse width as the pulse of the first-second scan signal and precedes the pulse of the first-second scan signal.

A method of driving a display device according to an another exemplary embodiment of the present disclosure includes: supplying a gate signal to a plurality of gate lines connected to a pixel circuit during a refresh frame period and a hold frame period; supplying a data voltage to a plurality of data lines, and supplying the data voltage, a second compensation voltage, and a third compensation voltage to the pixel circuit during the refresh frame period; and supplying a first compensation voltage to the data lines, and supplying the first compensation voltage, the second compensation voltage, and the third compensation voltage to the pixel circuit during the hold frame period. The gate signal includes pulses of a first-first scan signal and a first-second scan signal sequentially output from a first shift register, a pulse of a second scan signal sequentially output from a second shift register, a pulse of a third scan signal sequentially output from a third shift register, and a pulse of an emission control signal sequentially output from a fourth shift register. The pulse of the first-first scan signal is generated and then the pulse of the first-second scan signal is generated. The pulse of the first-first scan signal has the same pulse width as the pulse of the first-second scan signal and precedes the pulse of the first-second scan signal.

Some period of the pulse of the first-first scan signal overlap the pulse of the first-second scan signal.

According to the present disclosure, the pixels may be driven by maintaining the data voltage stored in the refresh frame in the hold frame, thereby driving the display device at low power.

According to the present disclosure, a difference in luminance characteristics of the pixels in the refresh frame and the hold frame may be reduced or minimized by applying a compensation voltage to the pixels in a low-power driving mode, thereby improving image quality.

According to the present disclosure, more gate signals may be output than the number of the shift registers in the gate driver that outputs the gate signals. Accordingly, according to the present disclosure, the circuit of the gate driver may be reduced in size, thereby reducing the size in which the gate driver is disposed on the display panel.

The effects of the present disclosure are not limited to the above-mentioned effects, and other effects that are not mentioned will be apparently understood by those skilled in the art from the following description and the appended claims.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which.

Figure 1:
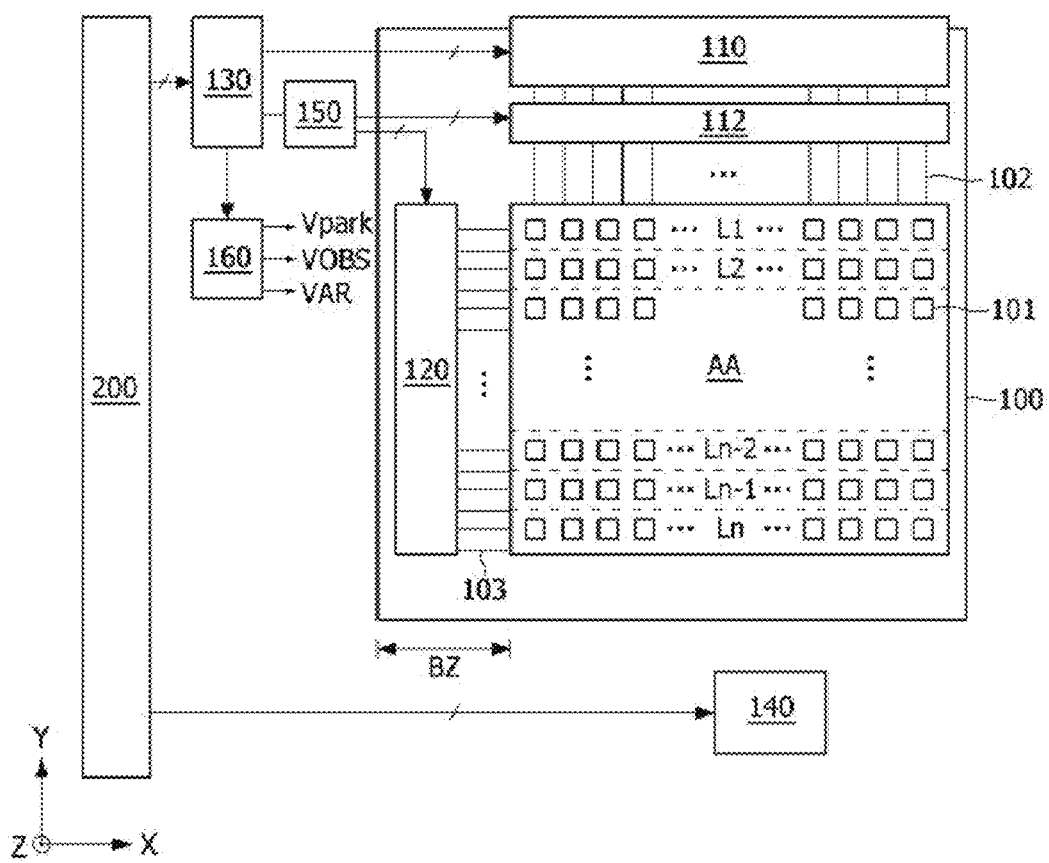
FIG. 1 is a block diagram illustrating a display device according to an exemplary embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Names of the respective elements used in the following explanations may be selected only for convenience of writing the specification and may be thus different from those used in actual products.

The advantages and features of the present disclosure and methods for accomplishing the same will be more clearly understood from exemplary embodiments described below with reference to the accompanying drawings. However, the present disclosure is not limited to the following exemplary embodiments but may be implemented in various different forms. Rather, the present exemplary embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "containing" used herein are generally intended to allow other components to be added unless the terms are used with the term "only." Any references to singular may include plural unless expressly stated otherwise.

Any implementation described herein as an "example" is not necessarily to be construed as preferred or advantageous over other implementations.

Components are interpreted to include an ordinary error range even if not expressly stated.

When a positional or interconnected relationship is described between two components, such as "on top of," "over," "above," "below," "next to," "beside," "connect or couple with," "crossing," "intersecting," or the like, one or more other components may be interposed between them, unless "immediately" or "directly" is used, that is, one or more other parts may be disposed located between the two parts. For example, where an element or layer is disposed "on" another element or layer, a third layer or element may be interposed therebetween.

When a temporal antecedent relationship is described, such as "after", "following", "next to", "before", or the like, it may not be continuous on a time base unless "just", "immediately" or "directly" is used.

The terms "first," "second,", "A", "B", "(a)", "(b)" and the like may be used to distinguish elements from each other, but the functions or structures of the components are not limited by ordinal numbers or component names in front of the components. For example, a first element could be termed a second element, and, similarly, a second element could be termed a first element, without departing from the scope of the present disclosure.

The following exemplary embodiments can be partially or entirely bonded to or combined with each other and can be linked and operated in technically various ways. The exemplary embodiments can be carried out independently of or in association with each other.

The pixel circuit and the gate drive circuit of the display device may include a plurality of transistors. The transistor may be implemented as a thin film transistor (TFT). The transistors may be implemented as an oxide thin film transistor (TFT) including an oxide semiconductor, a low temperature poly silicon TFT (LTPS TFT) including a low temperature poly silicon, and the like. For example, the oxide semiconductor material may be formed of any one of indium gallium zinc oxide (IGZO), indium zinc oxide (IZO), indium gallium tin oxide (IGTO), and indium gallium oxide (IGO), but is not limited thereto.

A transistor is basically a three-electrode element including a gate, a source, and a drain. The source is an electrode through which carriers are supplied to the transistor. The transistor of the present disclosure may be implemented with a four-terminal element to which a back gate bias is applied in order to shift a threshold voltage to a desired voltage. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (p-channel metal-oxide semiconductor (PMOS)), since carriers are holes, a source voltage is higher than a drain voltage such that holes may flow from a source to a drain. In the p-channel transistor, since holes flow from the source to the drain, current flows from the source to the drain. It should be noted that a source and a drain of a transistor are not fixed. For example, a source and a drain may be changed according to an applied voltage. Therefore, the disclosure is not limited to a source and a drain of a transistor. In the following description, a source and a drain of a transistor will be referred to as a first electrode and a second electrode.

A gate pulse may swing between a gate-on voltage and a gate-off voltage. The gate-on voltage is set higher than the threshold voltage of the transistor. The gate-off voltage is set lower than the threshold voltage of the transistor. A transistor is turned on in response to a gate-on voltage and is turned off in response to a gate-off voltage. In the case of an n-channel transistor, the gate-on voltage may be a gate high voltage VGH, and the gate-off voltage may be a gate low voltage VGL. In the case of a p-channel transistor, the gate-on voltage may be the gate low voltage VGL, and the gate-off voltage may be the gate high voltage VGH.

Hereinafter, various exemplary embodiments of the present disclosure will be described in detail with reference to the accompanying drawings. For convenience of description, a scale of each of elements illustrated in the accompanying drawings differs from a real scale, and thus, is not limited to a scale illustrated in the drawings.

Figure 2:
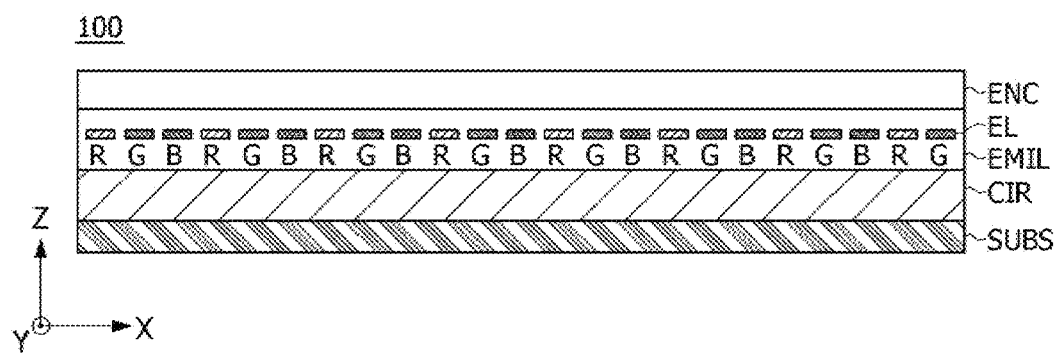
FIG. 2 is a cross-sectional view illustrating a cross-sectional structure of the display panel shown in FIG. 1 according to an exemplary embodiment of the present disclosure.
Figure 3:
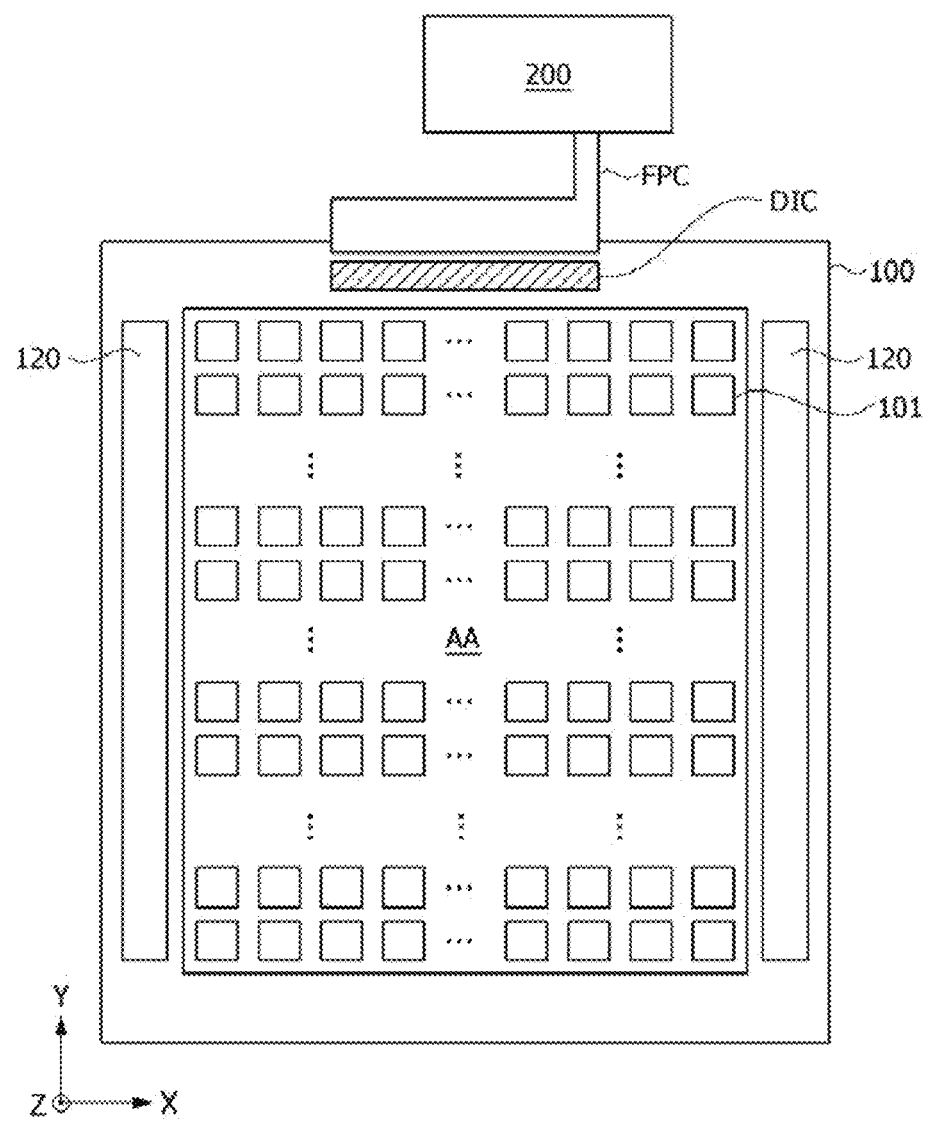
FIG. 3 is a diagram schematically illustrating a display device of a mobile terminal according to an exemplary embodiment of the present disclosure.

FIG. 1 is a block diagram illustrating a display device according to an exemplary embodiment of the present disclosure. FIG. 2 is a cross-sectional view illustrating a cross-sectional structure of the display panel shown in FIG. 1 according to an exemplary embodiment of the present disclosure. FIG. 3 is a diagram schematically illustrating a display device of a mobile terminal according to an exemplary embodiment of the present disclosure.

Referring to FIGS. 1 to 3, the display device according to an exemplary embodiment of the present disclosure may include a display panel 100 which displays an image, a display panel driving circuit for writing pixel data to pixels 101 of the display panel 100, and a power supply 140 for generating power necessary for driving the pixels and the display panel driving circuit, and the present disclosure is not limited thereto. For example, the image may include an electronic image, a digital image, a still image, or a video or a moving image, or the like.

The display panel 100 may be made of a plastic substrate, a thin glass substrate, a metal substrate, or a flexible polymer film substrate, or the like. The pixels 101 are implemented on the display panel 100. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto.

The display panel 100 may be, but is not limited to, a panel having a rectangular structure with a length in the X-axis direction, a width in the Y-axis direction, and a thickness in the Z-axis direction. The display panel 100 may include a display area AA and a non-display area BZ outside the display area AA. The display area AA of the display panel 100 includes a pixel array for displaying an input image thereon. The pixel array includes a plurality of data lines 102, a plurality of gate lines 103 intersecting the data lines 102, and the pixels 101 arranged in a matrix form. The display panel 100 may further include power lines commonly connected to the pixels 101. The power lines are connected to constant voltage nodes of the pixel circuits and supply the constant voltages necessary for driving the pixels 101 to the pixels 101.

Each of the pixels 101 may be divided into a plurality of sub-pixels, such as, a red sub-pixel, a green sub-pixel, and a blue sub-pixel for color implementation, but are not limited thereto. Each of the plurality of sub-pixels may further include a white sub-pixel. Each sub-pixel includes a pixel circuit for driving a light-emitting element. Each of the pixel circuits is connected to wires such as the data lines, the gate lines, the power lines, and the like. Hereinafter, a "pixel" may be interpreted as having the same meaning as a "sub-pixel."

The pixels may be arranged in the form of real color pixels and pentile pixels. A pentile pixel may realize a higher resolution than a real color pixel by driving two sub-pixels having different colors as one pixel 101 by using a preset pixel rendering algorithm. The pixel rendering algorithm may compensate for inadequate color representation in each pixel with the color of light emitted from its adjacent pixel.

The pixel array may include a plurality of pixel lines L1 to Ln. Each of the pixel lines L1 to Ln includes one line of pixels arranged in the line direction (X-axis direction) along the gate line direction in the pixel array of the display panel 100. The pixels arranged in one pixel line may share the gate lines 103, and the present disclosure is not limited thereto. The sub-pixels arranged in the column direction (Y) along the data line direction may share the same data line 102, and the present disclosure is not limited thereto. One horizontal period is a time obtained by dividing one frame period by the total number of pixel lines L1 to Ln.

The display panel 100 may be implemented with a non-transmissive display panel or a transmissive display panel. The transmissive display panel may be applied to a transparent display device in which an image is displayed on a screen and an actual object in the background is visible. The display panel 100 may be made as a flexible display panel. The display panel 100 may be a liquid crystal display panel, but embodiments of the present disclosure are not limited thereto. For example, the display panel 100 may be a light emitting display panel, an electrophoretic display panel, a micro light emitting diode display panel, an electrowetting display panel, a quantum dot light emitting display panel, or the like.

The cross-sectional structure of the display panel 100 may include a circuit layer CIR, a light-emitting element layer EMIL, and an encapsulation layer ENC that are stacked on a substrate SUBS, or the like, as shown in FIG. 2.

The circuit layer CIR may include a thin-film transistor (TFT) array including a pixel circuit connected to wires such as a data line, a gate line, and/or a power line, and the like, a de-multiplexer array 112, and a gate driver 120. The circuit layer CIR includes a plurality of metal layers insulated with insulating layers interposed therebetween, and a semiconductor material layer.

The light-emitting element layer EMIL may include a light-emitting element driven by the pixel circuit. The light-emitting element EL may include a plurality of light-emitting elements, such as a light-emitting element of a red sub-pixel, a light-emitting element of a green sub-pixel, and a light-emitting element of a blue sub-pixel, without being limited thereto. As an example, sub-pixels emitting light of other colors (such as, magenta, cyan, or yellow) are also possible. In another embodiment, the light-emitting element layer EMIL may further include a light-emitting element of white sub-pixel and a color filter. The light-emitting element layer EMIL in each of the sub-pixels may have a structure in which the light-emitting element and a color filter are stacked. The light-emitting elements EL in the light-emitting element layer EMIL may be covered by multiple protective layers including an organic film and an inorganic film.

The encapsulation layer ENC may cover the light-emitting element layer EMIL to seal the circuit layer CIR and the light-emitting element layer EMIL. The encapsulation layer ENC may also have a multi-insulating film structure in which an organic film and an inorganic film are alternately stacked. The inorganic film blocks permeation of moisture and oxygen. The organic film planarizes the surface of the inorganic film. When the organic film and the inorganic film are stacked in multiple layers, the movement path of moisture and oxygen becomes longer compared to a single layer, so that the penetration of moisture and oxygen that affect the light-emitting element layer EMIL may be effectively blocked.

A touch panel (or a touch sensor layer) which is disposed over the display panel 100 or embedded into the display panel 100, not shown, may be formed on the encapsulation layer ENC, and a polarizer or a color filter layer may be disposed thereon. The touch sensor layer may include capacitive touch sensors that sense a touch input based on a change in capacitance before and after the touch input. The touch sensor layer may include metal wire patterns and insulating films that forms the capacitance of the touch sensors. The insulating films may insulate a portion where the metal wire patterns intersect, and may planarize the surface of the touch sensor layer. The polarizer may improve visibility and contrast ratio by converting the polarization of external light reflected by metal of the touch sensor layer and the circuit layer. The polarizer may be implemented as a polarizer or a circular polarizer to which a linear polarizer and a phase retardation film are bonded. A cover glass may be adhered to the polarizer. The color filter layer may include a plurality of different color filters, such as red, green, and blue color filters, without being limited thereto. As an example, color filters filtering light of other colors (such as, magenta, cyan, or yellow) are also possible. The color filter layer may further include a black matrix pattern. The color filter layer may replace the polarizer by absorbing a part of the wavelength of light reflected from the circuit layer and the touch sensor layer, and increase the color purity of an image reproduced in the pixel array.

The power supply 140 generates the constant voltages (or direct current (DC) voltages) required for driving the pixel array and the display panel driving circuit of the display panel 100 using a DC-DC converter. The DC-DC converter may include a charge pump, a regulator, a buck converter, a boost converter, and the like. The power supply 140 may adjust the level of the DC input voltage applied from a host system 200 to output the constant voltages such as a gamma reference voltage, a gate-high voltage, a gate-low voltage, a pixel driving voltage, a cathode voltage, and an initialization voltage. The gamma reference voltage is supplied to the data driver 110. A dynamic range of the data voltage output from the data driver 110 is determined by a voltage range of the gamma reference voltage. The dynamic range of the data voltage is the range of voltages between the uppermost grayscale voltage and the lowermost grayscale voltage.

The gate-high voltage and the gate-low voltage are supplied to a level shifter 150 and the gate driver 120. The constant voltages such as the pixel driving voltage, the cathode voltage, and the initialization voltage, or the like are supplied to the pixels 101 by the power lines commonly connected to the pixels 101.

The pixel driving voltage may be output from a main power source of the host system 200 and supplied to the display panel 100. In this case, the power supply 140 does not need to output the pixel driving voltage.

The display panel driving circuit writes the pixel data of the input image to the pixels of the display panel 100 under the control of the timing controller 130. The display panel driving circuit may include the data driver 110 and the gate driver 120, but are not limited thereto. Further, the display panel driving circuit may further include a de-multiplexer array 112 disposed between the data driver 110 and the data lines 102.

The de-multiplexer array 112 sequentially supplies a data voltage output from channels of the data driver 110 to the data lines 102 using a plurality of de-multiplexers (DE-MUX). A de-multiplexer may include a multiple of switch elements disposed on the display panel 100. When the de-multiplexer is disposed between the output terminals of the data driver 110 and the data lines 102, the number of the channels of the data driver 110 may be reduced. The de-multiplexer array 112 may be omitted or may be briefly provided.

The display panel driving circuit may further include a touch sensor driver for driving touch sensors. The touch sensor driver is omitted from FIG. 1. The data driver 110 and the touch sensor driver may be integrated into one drive IC (Integrated Circuit). In a mobile terminal or a wearable terminal, the timing controller 130, the power supply 140, the level shifter 150, the data driver 110, the touch sensor driver, a compensation voltage generator, and the like may be integrated into one drive IC (DIC) as shown in FIG. 3.

The data driver 110 receives the pixel data of the input image received as a digital signal from the timing controller 130 and outputs the data voltage. The data driver 110 converts the pixel data of an input image into a gamma compensation voltage using a digital to analog converter (DAC) to output the data voltage. The gamma reference voltage (VGMA) is divided into the gamma compensation voltage for each grayscale by a voltage divider circuit in the data driver 110, which is supplied to the DAC. The DAC generates the data voltage as the gamma compensation voltage corresponding to the grayscale value of the pixel data. The data voltage from the DAC may be output to the data lines 102 from the respective channels of the data driver 110 through an output buffer, or may be output to the data lines 102 through the de-multiplexer array 112.

The gate driver 120 may be formed in a circuit layer CIR on the display panel 100 together with the TFT array of the pixel array and wires. The gate driver 120 may be disposed in the non-display area BZ outside the display area AA in the display panel 100, or at least a portion thereof may be disposed in the display area AA.

The gate driver 120 may include a plurality of shift registers for sequentially shifting pulses of the gate signals. The gate driver 120 may be disposed in either a left non-display area BZ or a right non-display area BZ outside the display area AA in the display panel 100 to supply the gate signals to the gate lines 103 in a single feeding method. In the single feeding method, the gate signals are applied to one ends of the gate lines. The gate driver 120 may be disposed in the left non-display area BZ and the right non-display area BZ in the display panel 100 to apply the gate signals to the gate lines 103 in a double feeding method. In the double feeding method, the gate signals are applied simultaneously to both ends of the gate lines 103. At least some circuits of the gate driver 120 may be disposed within the display area AA.

The gate driver 120 sequentially outputs pulses of the gate signals to the gate lines 103 under the control of the timing controller 130. The gate driver 120 may sequentially supply the gate signals to the gate lines 103 by shifting the pulses of the gate signals using the shift register. The gate driver 120 may utilize a plurality of shift registers to output a plurality of the gate signals having different phases, pulse widths, etc. A gate signal may include various gate pulses such as a scan signal and an emission control signal (hereinafter, referred to as an "EM signal") in the organic light-emitting display device.

The timing controller 130 receives from the host system 200 digital video data of the input image and a timing signal synchronized with this data. The timing signal may include a vertical synchronization signal Vsync, a horizontal synchronization signal Hsync, a data enable signal DE, and the like. Since a vertical period and a horizontal period may be known by counting the data enable signal DE, the vertical synchronization signal Vsync and the horizontal synchronization signal Hsync may be omitted. The data enable signal DE has an interval of one horizontal period (1H).

The timing controller 130 generates a data timing control signal for controlling the operation timing of the data driver 110, a MUX control signal for controlling the operation timing of the de-multiplexer array 112, and a gate timing control signal for controlling the operation timing of the gate driver 120 based on the timing signals Vsync, Hsync, and DE received from the host system 200. The timing controller 130 synchronizes the data driver 110, the de-multiplexer array 112, the touch sensor driver, and the gate driver 120 by controlling the operation timing of the display panel driving circuit.

The gate timing control signal generated from the timing controller 130 may be input to the shift register in the gate driver 120 through the level shifter 150. The gate timing control signal may include a start pulse, clock, or the like. The level shifter 150 may receive the gate timing control signal to generate a start pulse and a shift clock, and provide them to the gate driver 120 through clock lines CL1 to CLn. The level shifter 150 may supply the MUX control signal to the de-multiplexer array 112. An input signal to the level shifter 150 may be a signal of a digital signal voltage level, and an output signal from the level shifter 150 may be an analog voltage signal that swings between the gate-high voltage VGH and the gate-low voltage VGL.

The host system 200 may include a main board of any of a television system, a set-top box, a navigation system, a personal computer (PC), an in-vehicle system, a mobile terminal such as a smartphone or an electronic pad, or a wearable terminal. The host system may scale an image signal from a video source to match the resolution of the display panel 100, and may transmit it to the timing controller 130 together with the timing signal.

In a mobile system, the host system 200 may be implemented by an application processor (AP). The host system 200 may transmit the pixel data of the input image to the drive IC (DIC) shown in FIG. 3 through a mobile Industry Processor Interface (MIPI). The host system 200 may be electrically connected to the drive IC (DIC) through a flexible printed circuit, for example, a flexible printed circuit (FPC), as shown in FIG. 3. The drive IC may be bonded to the display panel 100 in a COG (Chip on Glass) process. The drive IC may be electrically connected to the wires on the display panel 100 as a chip on film (COF) structure mounted on a flexible circuit film.

The timing controller 130 or the host system 200 may enter a low power mode to reduce or minimize the power consumption of the display device when a still image or always on display (AOD) data is input. In a normal mode, the pixels 101 may have a refresh rate of 60 Hz, 144 Hz, 240 Hz, or the like. The refresh rate is the frequency at which the pixel data is written to the pixels 101. In the low power mode, the refresh rate of the pixels 101 is reduced to a frequency lower than 60 Hz, for example, 1 Hz to 30 Hz. When the refresh rate is 1 Hz, a first frame out of 60 frames per second may be a refresh frame, and the next 59 frames may be holding frames. After a data voltage Vdata of the pixel data is charged to the pixels 101 during a refresh frame period, the pixels 101 may hold the data voltage charged in a previous refresh frame without newly charging the data voltage Vdata during a continuous holding frame period, so that a light-emitting state is maintained.

The display panel driving circuit may include the compensation voltage generator 160 that outputs the compensation voltages Vpark, VOBS, and VAR. At least a portion of the compensation voltage generator 160 may use resources from other components, such as the power supply 140, the data driver 110, the display panel 100, and the like. The compensation voltage generator 160 may vary the voltage level of each of the compensation voltages Vpark, VOBS, and VAR under the control of the timing controller 130. The power supply 140 may be implemented as a single power supply IC together with the compensation voltage generator 160.

Each of the sub-pixels includes a driving element for driving the light-emitting element and a pixel circuit including a capacitor connected to the driving element. The pixel circuit of each of the sub-pixels may include an internal compensation circuit to compensate the data voltage by a threshold voltage of the driving element.

Figure 4:
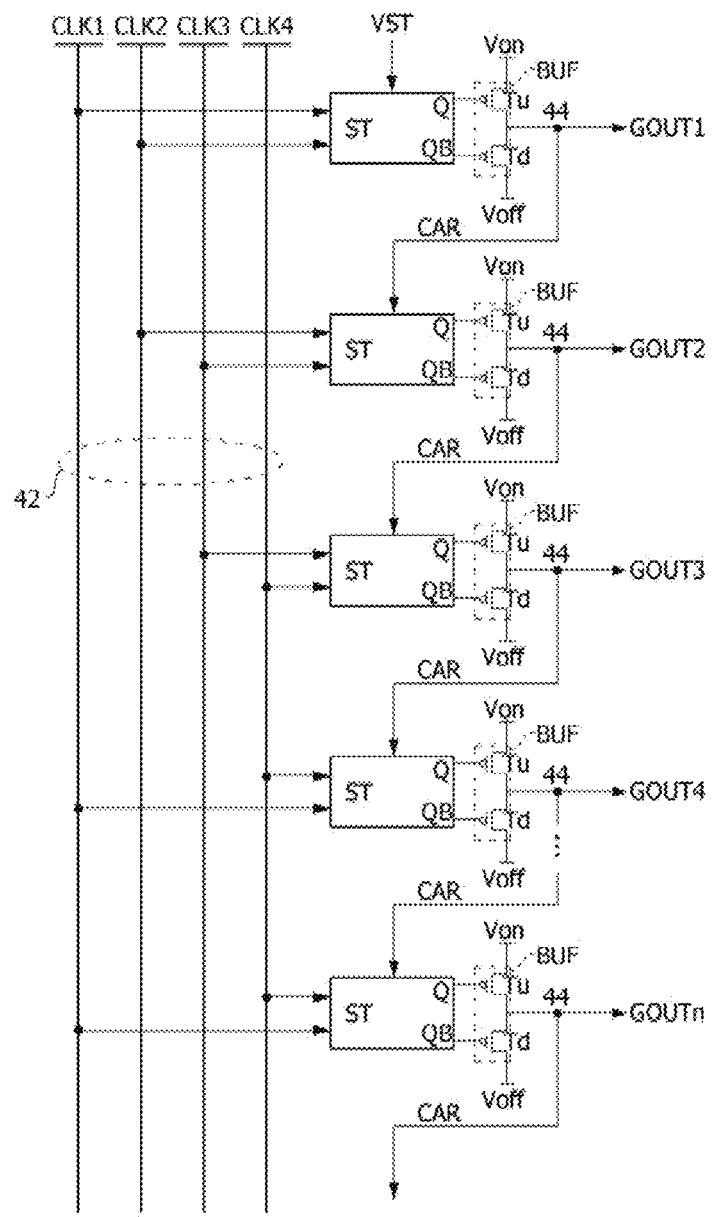
FIG. 4 is a diagram schematically illustrating a shift register in a gate driver according to an exemplary embodiment of the present disclosure.

FIG. 4 is a diagram schematically illustrating a shift register in the gate driver according to an exemplary embodiment of the present disclosure.

Referring to FIG. 4, the gate driver includes one or more shift registers. The shift register includes a plurality of signal transmission parts ST connected in cascade. The shift register may be implemented with any known shift register circuit for driving the display panel. The signal transmission part may be interpreted as a stage circuit of the shift registers. Each of the signal transmission parts includes a CLK node to which clocks CLK1 to CLK4 are input, a VST node to which a start pulse VST or a carry signal from a previous signal transmission part is input, a first control node Q, a second control node QB, an output node 44, and a buffer BUF that charges and discharges the output node 44 in response to voltages on the control nodes Q and QB to output pulses of gate signals.

The clocks CLK1 to CLK4 are sequentially shifted in phase. The signal transmission parts ST may receive one or more clock as inputs. In FIG. 4, each of the signal transmission parts ST receives two clocks as inputs, but are not limited thereto. In the example of FIG. 4, the CLK nodes of the signal transmission parts ST may be connected to clock wires 42 disposed in the non-display area BZ of the display panel 100 to receive the clocks CLK1 to CLK4. A first signal transmission part ST may receive first and second clocks CLK1, CLK2 and a start pulse, and may output a pulse of a gate signal GOUT1 and a pulse of a carry signal CAR. A second signal transmission part ST may receive second and third clocks CLK2, CLK3 and a pulse of a first carry signal CAR, and output a pulse of a second gate signal GOUT2 and a pulse of a second carry signal CAR. An (n)th (where n is a natural number) signal transmission part ST may receive the first and fourth clocks CLK1, CLK4 and a pulse of an (n-1)th carry signal CAR from an (n-1)th signal transmission part, and output a pulse of an (n)th gate signal GOUTn and a pulse of an (n)th carry signal CAR.

The buffer BUF includes a first buffer transistor Tu controlled by a voltage of the first control node Q, and a second buffer transistor Td controlled by a voltage of the second control node QB.

The first buffer transistor Tu is turned on in response to the voltage of the first control node Q to charge the voltage of the output node 44 to a gate-on voltage Von. The first buffer transistor Tu includes a gate electrode connected to the first control node Q, a first electrode to which the gate-on voltage Von is applied, and a second electrode connected to the output node 44.

The second buffer transistor Td is turned on in response to the voltage of the second control node QB to supply a gate-off voltage Voff to the output node 44. The second buffer transistor Td includes a gate electrode connected to the second control node QB, a first electrode connected to the output node 44, and a second electrode to which the gate-off voltage Voff is applied.

Meanwhile, the signal transmission parts ST may output pulses of gate signals GOUT1 to GOUTn through first output nodes and pulses of carry signals CAR through separate second output nodes, respectively.

Figure 5:
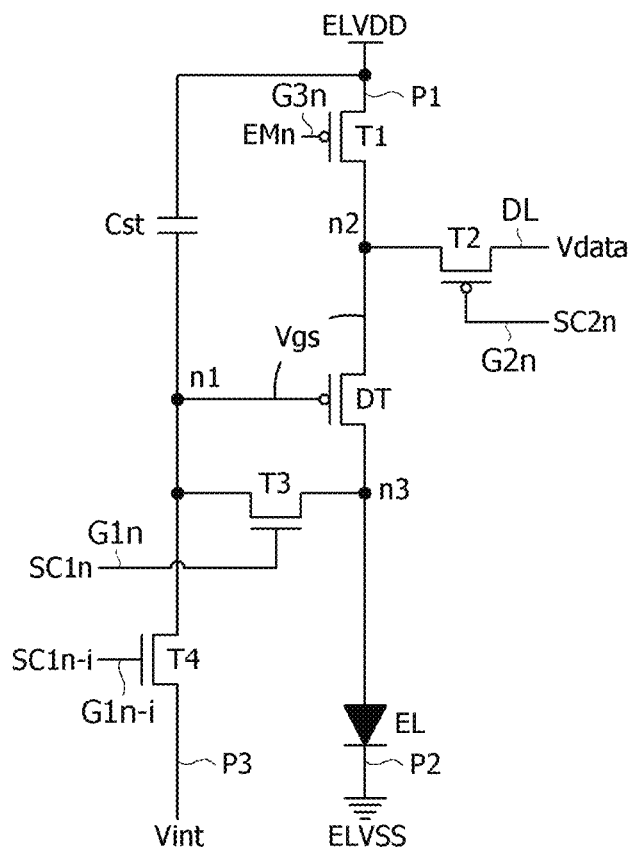
FIG. 5 is a circuit diagram illustrating a pixel circuit according to an exemplary embodiment of the present disclosure.

FIG. 5 is a circuit diagram illustrating a pixel circuit according to an exemplary embodiment of the present disclosure.

Referring to FIG. 5, the pixel circuit may include a light-emitting element EL, a driving element DT for driving the light-emitting element EL, a plurality of switch elements such as switch elements T1 to T4, and a capacitor Cst, and the like, but are not limited thereto.

Figure 6:
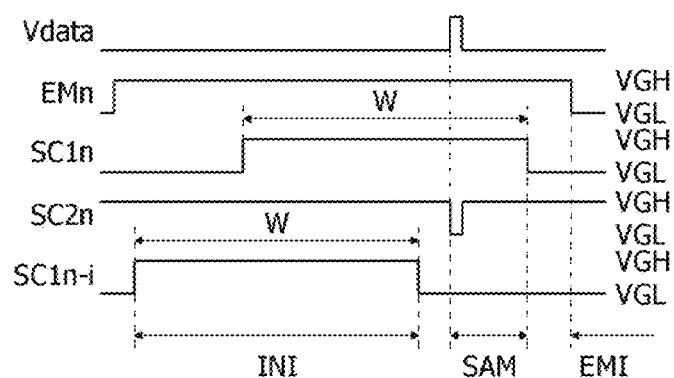
FIG. 6 is a waveform diagram illustrating gate signals and a data voltage applied to the pixel circuit shown in FIG. 5 according to an exemplary embodiment of the present disclosure.

As one example, third and fourth switch elements T3 and T4 each may be implemented as an n-channel oxide TFT with a low off-current. The driving element DT and each of first and second switch elements T1 and T2 may be implemented as a p-channel LTPS TFT with good on-current characteristics. The n-channel oxide TFT may be turned on in response to the gate-high voltage VGH, while it is turned off in response to the gate-low voltage VGL, as illustrated in FIG. 6. The p-channel LTPS TFT may be turned on in response to the gate-low voltage VGL, while it is turned off in response to the gate-high voltage VGH, as illustrated in FIG. 6. For example, the first switch element T1 is turned on or off in response to the EM signal EMn, and the second switch element T2 is turned on or off in response to the second scan signal SC2n.

The pixel circuit is connected to a data line DL to which a data voltage Vdata of pixel data is applied, and to gate lines G1n, G1n-i, G2n, and G3n to which gate signals SC1n, SC1n-i, SC2n, and EMn are applied. The pixel circuit may be connected to a first power line P1 to which a pixel driving voltage ELVDD is applied, a second power line P2 to which a cathode voltage ELVSS is applied, and a third power line P3 to which an initialization voltage Vint is applied. On the display panel, the power lines P1, P2, and P3 may be connected in common to all of the pixels 101.

The pixel driving voltage ELVDD and the cathode voltage ELVSS are set to a voltage that allows the driving element DT to operate in a saturation region. The cathode voltage ELVSS may be set to a voltage lower than the pixel driving voltage ELVDD. The gate-high voltage VGH may be set to a voltage higher than the pixel driving voltage ELVDD, and the gate-low voltages VGL may be set to a voltage lower than the cathode voltage ELVSS.

For example, the data voltage Vdata may have a dynamic range between 2 V and 6V. Within this dynamic range, the voltage level of the data voltage Vdata is selected depending on a grayscale value of the pixel data. The initialization voltage Vint may set to, but is not limited to, a voltage lower than a lower limit of the data voltage Vdata and higher than the cathode voltage ELVSS. The voltage difference between the initialization voltage Vint and the cathode voltage ELVSS is the voltage lower than the threshold voltage of the light-emitting element EL.

The gate signals SC1n, SC1n-i, SC2n, and EMn include pulses that swing between the gate-high voltage VGH and the gate-low voltage VGL. First scan signals Sc1n and SC1n-i includes a first-first scan signal SC1n-i and a first-second scan signal SC1n, which are sequentially output from one shift register. After the first-first scan signal SC1n-i is output from the shift register, the first-second scan signal SC1n is output. A pulse of the first-second scan signal SC1n is later in phase than a pulse of the first-first scan signal SC1n−1 and has the same pulse width W. Herein, n and i are natural numbers, where n is greater than i. Here, i may be, but is not limited to, a value between 1 and 16. Some period of the pulse of the first-first scan signal SC1n-i may overlap some period of the pulse of the first-second scan signal SC1n.

As one example, the driving element DT may include a gate electrode connected to a first node n1, a first electrode connected to a second node n2, and a second electrode connected to a third node n3. The capacitor Cst may connected between a node on a first power line P1, to which the pixel driving voltage ELVDD is applied, and the first node n1.

Figure 9A:
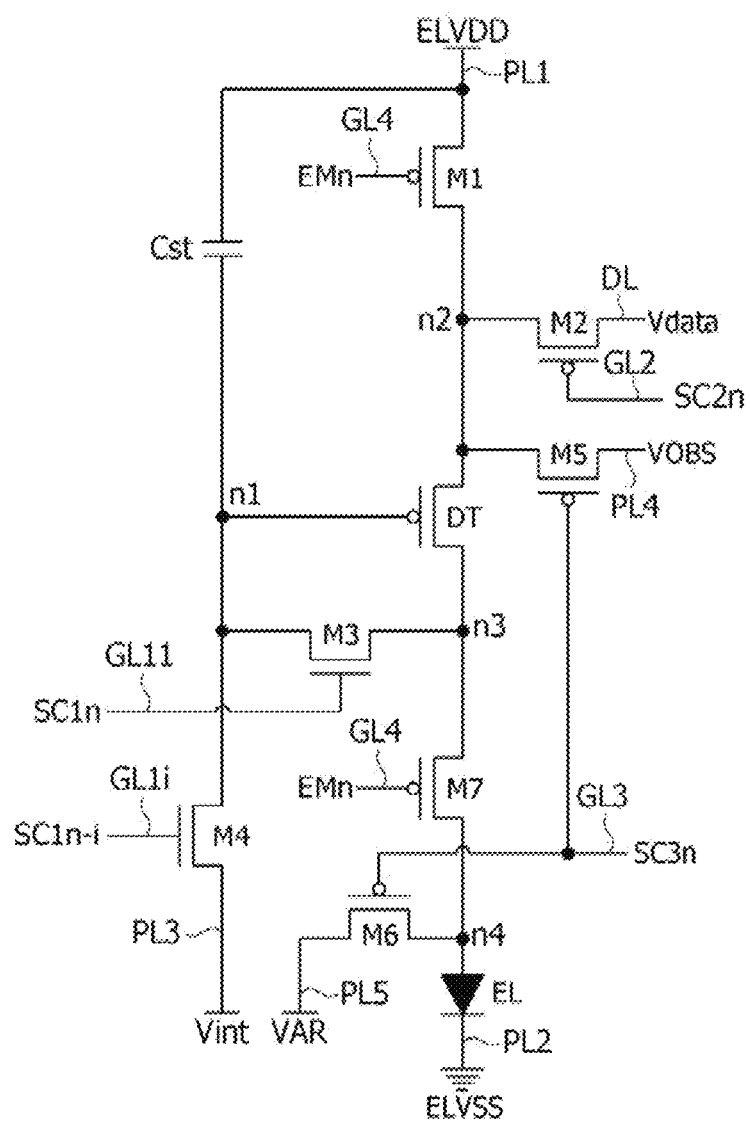
FIGS. 9A and 9B are circuit diagrams illustrating pixel circuits according to another exemplary embodiment of the present disclosure.
Figure 9B:
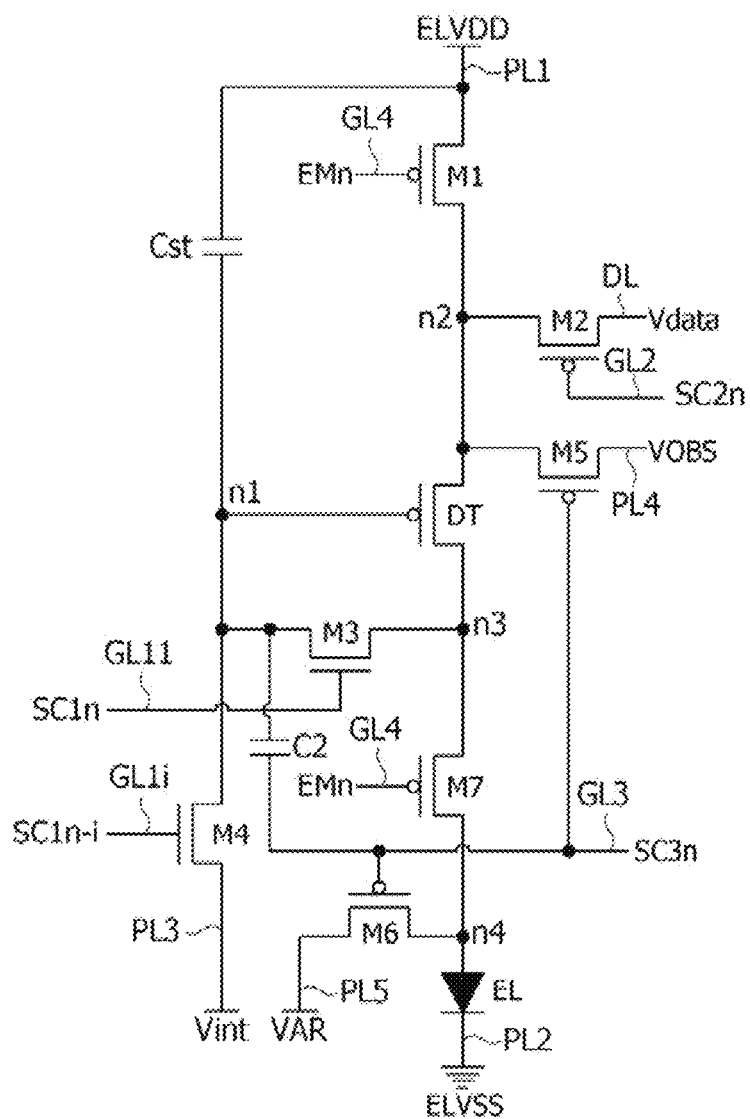

The light-emitting element EL may be implemented as an organic OLED or inorganic LED. The OLED includes an anode electrode, a cathode electrode, and an organic compound layer interposed between these electrodes. In an exemplary embodiment, a first electrode such as an anode electrode of the light-emitting element EL may be electrically connected to the third node n3, and a second electrode such as a cathode electrode thereof is connected to the second power line P2 to which the cathode voltage ELVSS is applied, as shown in FIG. 5. In other exemplary embodiments, the anode electrode of the light-emitting element EL may be connected to the fourth node n4 as shown in FIGS. 9A and 9B. The organic compound layer may include, but is not limited to, a hole injection layer (HIL), a hole transport layer (HTL), a light emission layer (EML), an electron transport layer (ETL), and an electron injection layer (EIL). When a voltage is applied to the anode and cathode electrodes of the light-emitting element EL, holes from the hole transport layer (HTL) and electrons from the electron transport layer (ETL) move to the light emission layer (EML) to form excitons. In this case, visible light is emitted from the light emission layer EML. The OLED may be implemented as an OLED having a tandem structure in which a plurality of light-emitting layers are stacked. The OLED having the tandem structure may improve the luminance and lifespan of the pixels. For example, the light-emitting layers may include one or more of a hole injection layer (HIL), a hole transmitting layer (HTL), an electron transmitting layer (ETL) and an electron injection layer (EIL), but the present disclosure is not limited thereto.

As one example, the first switch element T1 is connected between the first power line P1, to which the pixel driving voltage ELVDD is applied, and the second node n2. Further, the first switch element T1 is turned on or off in response to the EM signal EMn, for example, the first switch element T1 is turned on in response to the gate-low voltage VGL of the EM signal EMn, and turned off in response to the gate-high voltage VGH of the EM signal EMn, but are not limited thereto. When the first switch element T1 is turned on, the pixel driving voltage ELVDD is applied to the second node n2. The first switch element T1 includes a gate electrode connected to a gate line G3n to which the EM signal EMn is applied, a first electrode connected to the first power line P1, and a second electrode connected to the second node n2.

As one example, the second switch element T2 is connected between the data line DL to which a data voltage Vdata of pixel data is applied and the second node n2. The second switch element T2 is turned on or off in response to a second scan signal SC2n, for example, the second switch element T2 is turned on in response to the gate-low voltage VGL of a second scan signal SC2n, and turned off in response to the gate-high voltage VGH of a second scan signal SC2n, but are not limited thereto. When the second switch element T2 is turned on, the data line DL to which the data voltage Vdata of the pixel data is applied is electrically connected to the second node n2. The second switch element T2 includes a gate electrode connected to the second gate line G2n to which the second scan signal SC2n is applied, a first electrode connected to the data line DL, and a second electrode connected to the second node n2.

As one example, the third switch element T3 is connected between the first node n1 and the third node n3. The third switch element T3 is turned on or off in response to the first-second scan signals SC1n, for example, the third switch element T3 is turned on in response to the gate-high voltage VGH of the first-second scan signals SC1n, and turned off in response to the gate-low voltage VGL of the first-second scan signals SC1n, but are not limited thereto. When the third switch element T3 is turned on, the driving element DT operates as a diode with its gate electrode and second electrode connected. The third switch element T3 includes a gate electrode connected to a first-second gate line G1n to which the first-second scan signal SC1n is applied, a first electrode connected to the first node n1, and a second electrode connected to the third node n3.

As one example, the fourth switch element T4 is connected between the first node n1 and the third power line P3 to which the initialization voltage Vint is applied. The fourth switch element T4 is turned on or off in response to the first-first scan signal SC1n-i, for example, the fourth switch element T4 is turned on in response to the gate-high voltage VGH of the first-first scan signal SC1n-i, and turned off in response to the gate-low voltage VGL of the first-first scan signal SC1n-i. When the fourth switch element T4 is turned on, the initialization voltage Vint is applied to the capacitor Cst and to the gate electrode of the driving element DT. The fourth switch element T4 includes a gate electrode connected to a first-first gate line G1n-i to which the first-first scan signal SC1n-i is applied, a first electrode connected to the first node n1, and a second electrode connected to the third power line P3 to which the initialization voltage Vint is applied.

Figure 7A:
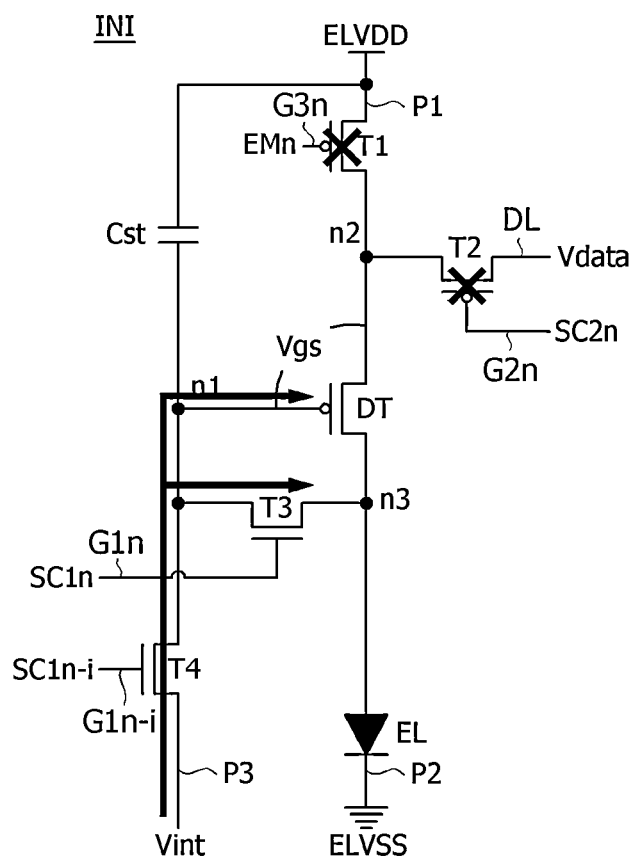
FIGS. 7A to 7C are circuit diagrams illustrating the operation of the pixel circuit shown in FIG. 5 in stages according to an exemplary embodiment of the present disclosure.
Figure 7B:
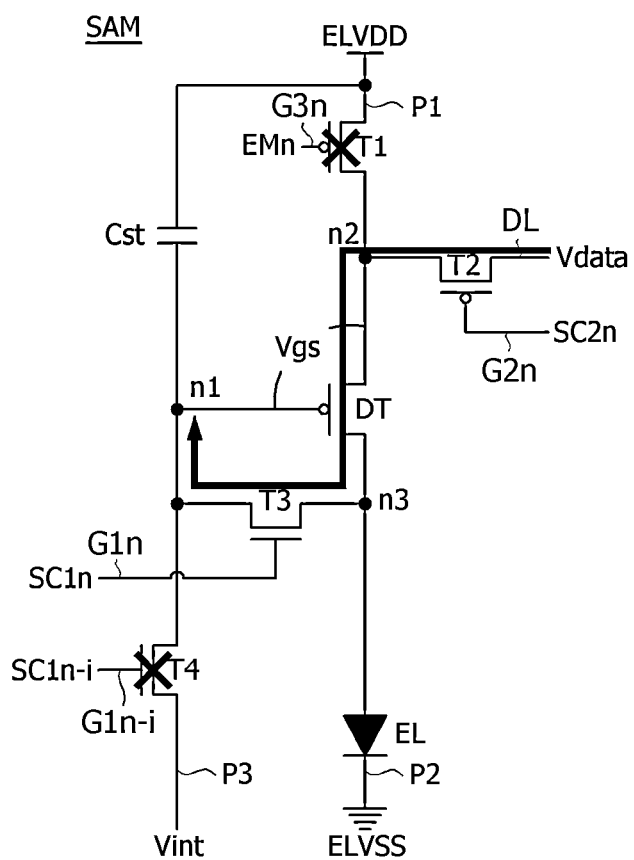
Figure 7C:
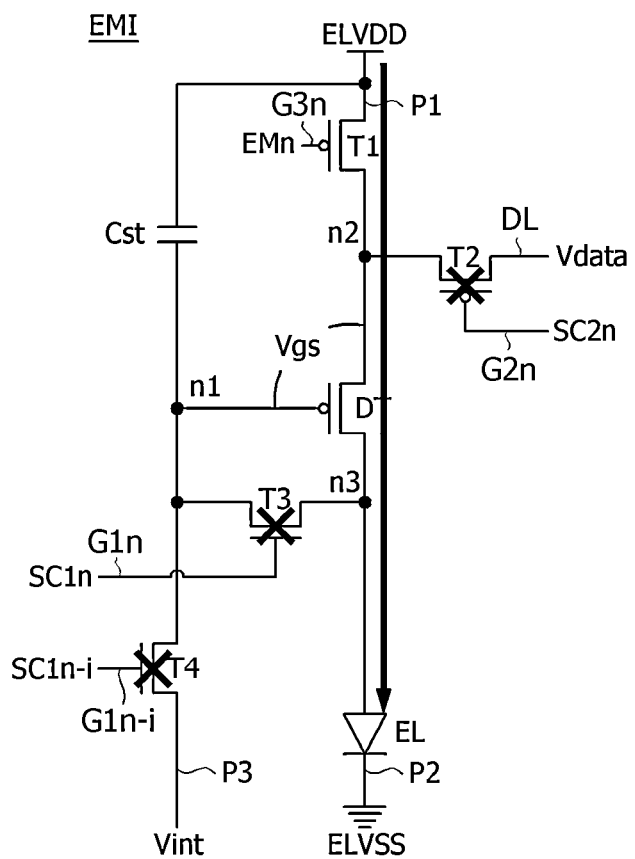

FIG. 6 is a waveform diagram illustrating gate signals and a data voltage applied to the pixel circuit shown in FIG. 5 according to one embodiment. FIGS. 7A to 7C are circuit diagrams illustrating the operation of the pixel circuit shown in FIG. 5 in stages according to one embodiment.

Referring to FIGS. 5 to 7C, the driving period of the pixels may include an initialization period INI, a sampling period SAM, and an emission period EMI.

During the initialization period INI, the first-first scan signal SC1n-i for controlling the turning-on and off of the fourth switch element T4 is generated as the gate-high voltage VGH, followed by the first-second scan signal SC1n for controlling the turning-on and off of the third switch element T3 is generated as the gate-high voltage VGH. During initialization period INI, the voltage of the second scan signal SC2n for controlling the turning-on and off of the second switch element T2 and the EM signal EMn for controlling the turning-on and off of the first switch element T1 are the gate-high voltage VGH. Therefore, during the initialization period INI, the third and fourth switch elements T3 and T4 are turned on, as shown in FIG. 7A, to apply the initialization voltage Vint to the first and third nodes n1 and n3. During the initialization period INI, the first and second switch elements T1 and T2 are in the off-state. During the initialization period INI, since no current flows through the light-emitting element EL, the light-emitting element EL is in the off-state and do not emit light.

During the sampling period SAM, the voltage of the second scan signal SC2n for controlling the turning-on and off of the second switch element T2 is generated as a pulse of the gate-low voltage VGL synchronized with the data voltage Vdata of the pixel data, and then inverted to the gate-high voltage VGH. During the sampling period SAM, the first-first scan signal SC1n-i for controlling the turning-on and off of the fourth switch element T4 is generated as a pulse of the gate-low voltage VGL. The pulse width of the second scan signal SC2n may be one horizontal period. During the sampling period SAM, the first node n1 and the third node n3 are connected through the third switch element T3 so that the driving element DT operates as a diode. During the sampling period SAM, the voltage of the first-second scan signals SC1n for controlling the turning-on and off of the third switch element T3 and the EM signal EMn for controlling the turning-on and off of the first switch element T1 may be the gate-high voltage VGH, whereas the voltage of the first-first scan signal SC1n may be the gate-low voltage VGL. When the second switch element T2 and the third switch element T3 are turned on in the sampling period SAM, the data voltage Vdata is applied to the second node n2, and the data voltage Vdata is also applied to the first and third nodes n1 and n3 through the driving element DT in the on-state, as shown in FIG. 7B. During the sampling period SAM, the first switch element T1 and the fourth switch element T4 are turned off, as shown in FIG. 7B. In this case, the voltage of the first node n1 is the data voltage Vdata, and the voltage of each of the second and third nodes n2 and n3 is a voltage of Vdata+Vth, which is obtained by adding the threshold voltage Vth of the driving element DT to the data voltage Vdata. During the sampling period SAM, the gate-to-source voltage Vgs of the driving element DT is the threshold voltage Vth of the driving element DT. At this time, the threshold voltage Vth of the driving element DT is sampled at the compensated data voltage Vdata+Vth and stored in the capacitor Cst. At the end of the sampling period SAM, the voltage of the capacitor Cst is given by a voltage of ELVDD−(Vdata+Vth). During the sampling period SAM, since no current flows through the light-emitting element EL, the EL does not emit light.

During the emission period EMI, the voltage of the first scan signals SC1n-i for controlling the turning-on and off of the fourth switch element T4, SC1n for controlling the turning-on and off of the third switch element T3 and the EM signal EMn for controlling the turning-on and off of the first switch element T1 is the gate-low voltage VGL, and the voltage of the second scan signal SC2n for controlling the turning-on and off of the second switch element T2 is the gate-high voltage VGH. During the emission period EMI, the first switch element T1 is turned on in response to the gate-low voltage VGL of the EM signal EMn to apply the pixel driving voltage ELVDD to the second node n2, as shown in FIG. 7C. During the emission period EMI, a current path is formed between the pixel driving voltage ELVDD and the cathode voltage ELVSS. During the emission period EMI, a current, which is determined according to the gate-source voltage Vgs of the driving element DT, flows through the light-emitting element EL, so that the light-emitting element EL may emit light at a luminance corresponding to the grayscale value of the pixel data. During the emission period EMI, the second, third, and fourth switch elements T2, T3, and T4 are in the off-state.

Figure 8:
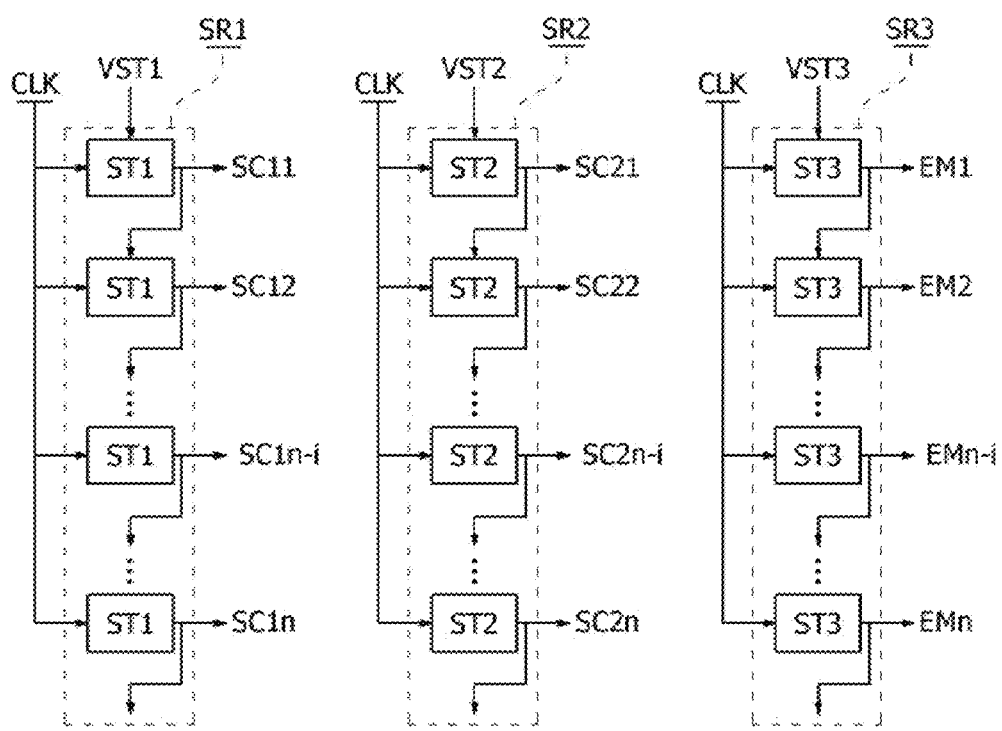
FIG. 8 is a diagram illustrating a gate driver for outputting the gate signals applied to the pixel circuit shown in FIG. 5 according to an exemplary embodiment of the present disclosure.

FIG. 8 is a diagram illustrating the gate driver 120 for outputting the gate signals applied to the pixel circuit shown in FIG. 5 according to one embodiment.

Referring to FIGS. 5 and 8, the gate driver 120 may include a plurality of shift registers for sequentially outputting the scan signals, for example, a first shift register SR1 for sequentially outputting pulses of the first scan signals SC1n-i, SC1n, a second shift register SR2 for sequentially outputting a pulse of the second scan signal SC2n, and a third shift register SR3 for outputting a pulse of the EM signal EMn, and the present disclosure is not limited thereto.

As one example, the first shift register SR1 may include a plurality of signal transmission parts ST1 connected in cascade. The first shift register SR1 receives a start pulse VST1 and a clock CLK and outputs the pulses of the first scan signal sequentially in the order of SC11, SC12 . . . . SC1n-i, and SC1n. For example, a first signal transmission part ST1 of the plurality of signal transmission parts ST1 receives the start pulse VST1, and all of the plurality of signal transmission parts ST1 receive the clock CLK.

The second shift register SR2 may include a plurality of signal transmission parts ST2 connected in cascade. The second shift register SR2 receives a start pulse VST2 and the clock CLK and outputs the pulses of the second scan signal sequentially in the order of SC21, SC22 . . . . SC2n-i, and SC2n. For example, a first signal transmission part ST2 of the plurality of signal transmission parts ST2 receives the start pulse VST2, and all of the plurality of signal transmission parts ST2 receive the clock CLK.

The third shift register SR3 may include a plurality of signal transmission parts ST3 connected in cascade. The third shift register SR3 receives a start pulse VST3 and the clock CLK and outputs the pulses of the EM signal sequentially in the order of EM1, EM2 EMn-i, and EMn. For example, a first signal transmission part ST3 of the plurality of signal transmission parts ST3 receives the start pulse VST3, and all of the plurality of signal transmission parts ST3 receive the clock CLK.

The clock CLK input to the shift registers SR1, SR2, and SR3 may be two or more clocks with different phases, and the present disclosure is not limited thereto. The start pulses and clocks input to the shift registers SR1, SR2, and SR3 may have one or more of a phase, a frequency, and a duty ratio different from each other.

The pixel circuit shown in FIG. 5 requires four gate signals SC1n, SC1n-i, SC2n, and EMn. In the present disclosure, three shift registers SR1, SR2, and SR3 are used to output the gate signals SC1n, SC1n-i, SC2n, and EMn, thereby allowing the circuit size of the gate driver 120 to be reduced or minimized. For example, the first shift register SR1 is used to output the gate signals SC11~SC1n, the second shift register SR2 is used to output the gate signals SC21~SC2n, and the third shift register SR3 is used to output the gate signals EM1~EMn. Meanwhile, the pixel circuit shown in FIG. 5 may have a lower driving frequency in low power mode. In this case, the data voltage Vdata is not applied to the pixel circuit in the hold frame.

FIGS. 9A and 9B are circuit diagrams illustrating pixel circuits according to another exemplary embodiments of the present disclosure.

Referring to FIGS. 9A and 9B, the pixel circuit may include a light-emitting element EL, a driving element DT for driving the light-emitting element EL, a plurality of switch elements M1 to M7, and a first capacitor Cst, or the like, but the present disclosure is not limited thereto. Further, the pixel circuit may further include a second capacitor C2, as shown in FIG. 9B.

Figure 11:
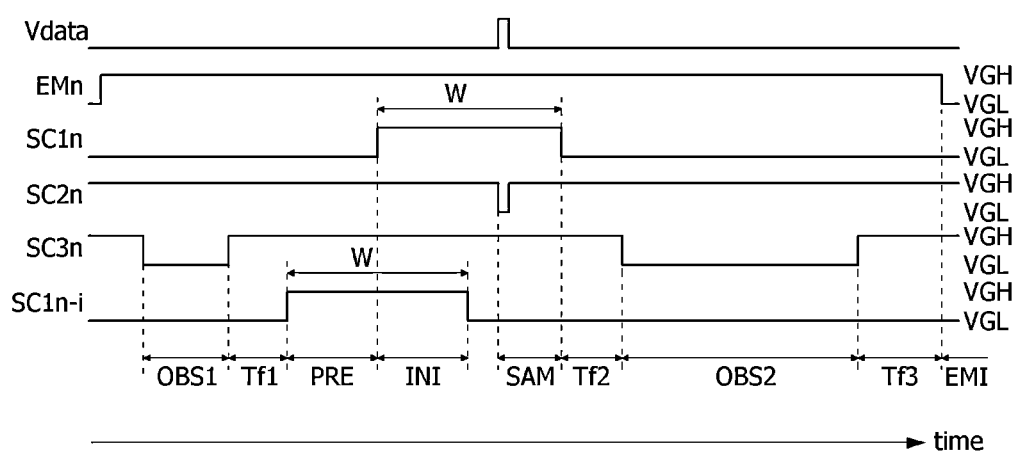
FIG. 11 is a waveform diagram illustrating gate signals and data voltages generated during a refresh frame according to an exemplary embodiment of the present disclosure.
Figure 13:
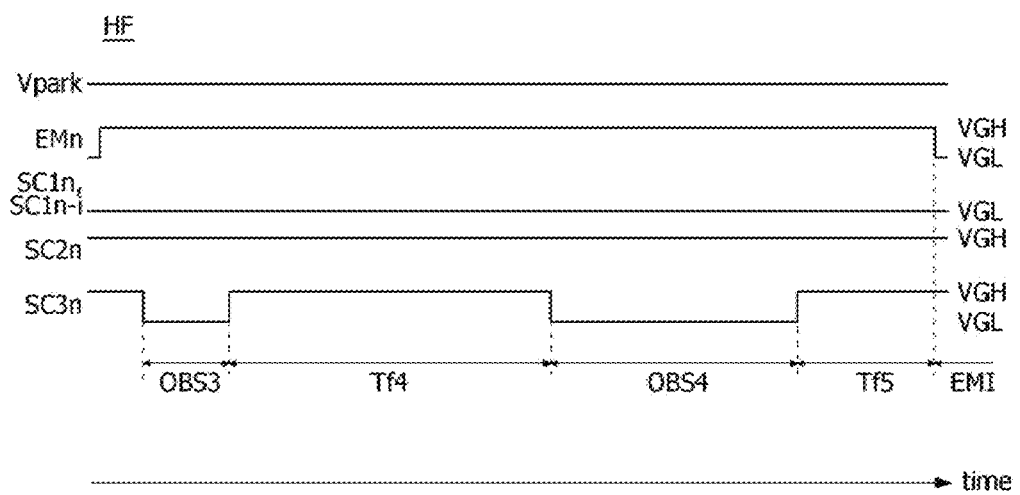
FIG. 13 is a waveform diagram illustrating gate signals and a first compensation voltage generated during a hold frame according to an exemplary embodiment of the present disclosure.

Third and fourth switch elements M3 and M4 each may be implemented as an n-channel oxide TFT, but the present disclosure is not limited thereto. The driving element DT and first, second, fourth, fifth, and sixth switch elements M1, M2, M5, M6, and M7 may be implemented as a p-channel LTPS TFT, but the present disclosure is not limited thereto. The n-channel oxide TFT is turned on in response to the gate-high voltage VGH, while it is turned off in response to the gate-low voltage VGL, as illustrated in FIGS. 11 and 13. The p-channel LTPS TFT is turned on in response to the gate-low voltage VGL, while it is turned off in response to the gate-high voltage VGH, as illustrated in FIGS. 11 and 13. That is, third and fourth switch elements M3 and M4 are turned on in response to the gate-high voltage VGH, and turned off in response to the gate-low voltage VGL. The driving element DT and first, second, fourth, fifth, and sixth switch elements M1, M2, M5, M6, and M7 are turned on in response to the gate-low voltage VGL, and turned off in response to the gate-high voltage VGH.

The pixel circuit is connected to the data line DL to which the data voltage Vdata of the pixel data and a first compensation voltage Vpark are applied, and to the gate lines GL11, GL1i, GL2, GL3, GL4, GL5 to which the gate signals SC1n, SC1n-i, SC2n, SC3n, EMn are applied. In low power mode, the data driver 110 supplies the data voltage Vdata to the data lines DL during the sampling period of a refresh frame period and does not output the data voltage Vdata during the hold frame period. During the hold frame period, the first compensation voltage Vpark is supplied to the data lines DL. The first compensation voltage Vpark may be applied from the compensation voltage generator 160.

The pixel circuit may be connected to a first power line PL1 to which the pixel driving voltage ELVDD is applied, a second power line PL2 to which the cathode voltage ELVSS is applied, a third power line PL3 to which the initialization voltage Vint is applied, a fourth power line PL4 to which a second compensation voltage VOBS is applied, and a fifth power line PL5 to which a third compensation voltage VAR is applied. On the display panel 100, the power supplies to which the power lines PL1 to PL5 are connected may be commonly connected to all of the pixels.

As one example, the pixel driving voltage ELVDD and the cathode voltage ELVSS may be set to, but is not limited to, a voltage that allows the driving element DT to operate in a saturation region. The pixel driving voltage ELVDD may be set to, but is not limited to, a voltage between 2V and 3 V, and the cathode voltage ELVSS may be set to, but is not limited to, a voltage between −8V and −10V, but are not limited thereto. The gate-high voltage VGH may be set to, but is not limited to, a voltage higher than the pixel driving voltage ELVDD, and the gate-low voltage VGL may be set to, but is not limited to, a voltage lower than the cathode voltage ELVSS, but are not limited thereto.

As one example, the data voltage Vdata may have a dynamic range between 2 V and 6V. Within this dynamic range, the voltage level of the data voltage Vdata is selected depending on a grayscale value of the pixel data. The initialization voltage Vint may set to, but is not limited to, a voltage lower than a lower limit of the data voltage Vdata and higher than the cathode voltage ELVSS. For example, when the data voltage Vdata has a lower limit voltage of 2V and the cathode voltage ELVSS has a lower limit voltage of −9V, the initialization voltage Vint may be set to a specific voltage between −5V and −7V.

As one example, the first compensation voltage Vpark may be set within a voltage range that is less than a dynamic range of the data voltage Vdata. For example, when the dynamic range of the data voltage Vdata is between 2 V and 6 V, the first compensation voltage Vpark may be set to a specific voltage between 4 V and 6 V, or may be varied within this voltage range.

As one example, the second compensation voltage VOBS may be set within a voltage range that is lower than the pixel driving voltage ELVDD and partially overlaps the dynamic range of the data voltage Vdata. For example, when the data voltage Vdata has a dynamic range between 2V and 6V, the second compensation voltage VOBS may be set to a specific voltage between 4V and 8V, or may be varied within this voltage range.

As one example, the third compensation voltage VAR may be set to a specific voltage, or it may be varied. For example, when the data voltage Vdata has a dynamic range between 2V and 6V, the third compensation voltage VAR may be set to a specific voltage between −4V and 8V, or may be varied within this voltage range.

As one example, the compensation voltages Vpark, VOBS, and VAR applied to one sub-pixel at a particular position in the display area AA may be set to different voltages, but the present disclosure is not limited thereto.

As one example, the gate signals SC1n, SC1n-i, SC2n, Sc3n, and EMn include a pulse that swings between the gate-high voltage VGH and the gate-low voltage VGL. For the pixel circuit shown in FIGS. 9A and 9B, the gate driver 120 may include a plurality of shift registers that output the scan signal, for example, a first shift register that outputs the first scan signals SC1n, Sc1n-i, a second shift register that outputs the second scan signal SC2n, a third shift register that outputs the third scan signal SC3n, a fourth shift register that outputs the fourth scan signal SC3n, and a fifth shift register that outputs the EM signal EMn, or the like, but the present disclosure is not limited thereto. Each of the first through fourth shift registers outputs pulses during the refresh frame, and shifts the pulses sequentially. The first and second shift registers have very low power consumption because they do not output pulses during the hold frame HF.

The first scan signals Sc1n and SC1n-i includes a first-first scan signal SC1n-i and a first-second scan signal SC1n, which are sequentially output from the first shift register. The first-first scan signal SC1n-i is output from the first shift register, and then the first-second scan signal SC1n is output. Some period of the pulse of the first-first scan signal SC1n-i may overlap some period of the pulse of the first-second scan signal SC1n. A pulse of the first-first scan signal SC1n-i is later in phase than a pulse of the first-second scan signal SC1n and has the same pulse width W.

As shown in FIGS. 9A and 9B, the driving element DT includes a gate electrode connected to a first node n1, a first electrode connected to a second node n2, and a second electrode connected to a third node n3. The first capacitor Cst is connected between a node on the first power line PL1, to which the pixel driving voltage ELVDD is applied, and the first node n1.

The first capacitor Cst charges the pixel driving voltage ELVDD and the voltage of the first node n1 to suppress the fluctuation of the gate-to-source voltage Vgs of the driving element DT that drives the light-emitting element EL.

As shown in FIG. 9B, the second capacitor C2 is connected between the first node n1 and the third gate line GL3 to which the third scan signal SC3n is applied. The second capacitor C2 suppresses the phenomenon that the gate voltage of the driving element DT fluctuates on the falling edge of the first-second scan signal SC1n, and compensates for the amount of fluctuation. As shown in FIG. 11, the voltage of the first-second scan signal SC1n may drop from the gate-high voltage VGH to the gate-low voltage VGL. At this time, the gate voltage of the driving element DT may be momentarily lowered due to a kickback voltage generated by the parasitic capacitance between the gate line GL11 and the first node n1 to which the voltage of the first-second scan signal SC1n is applied. The second capacitor C2 may suppress the kickback voltage to the gate-high voltage VGH applied to the gate line GL3 when the voltage on a gate line GL11 to which the voltage of the first-second scan signal SC1n is applied is lowered to the gate-low voltage VGL. In addition, the second capacitor C2 may compensate for the fluctuation of the gate voltage of the driving element DT, which is lowered by the kickback voltage, when the voltage of the gate line GL3, to which the voltage of the third scan signal SC3n is applied, rises to the gate-high voltage VGH.

The light-emitting element EL may include a first electrode such as an anode electrode connected to the fourth node n4 and a second electrode such as a cathode electrode connected to the second power line PL2 to which the cathode voltage ELVSS is applied.

As one example, the first switch element M1 is connected between the first power line PL1, to which the pixel driving voltage ELVDD is applied, and the second node n2. The first switch element M1 is turned on or off in response to the EM signal EMn, for example, the first switch element M1 is turned on in response to the gate-low voltage VGL of the EM signal EMn, and turned off in response to the gate-high voltage VGH of the EM signal EMn, but the present disclosure is not limited thereto. When the first switch element M1 is turned on, the pixel driving voltage ELVDD is applied to the second node n2. The first switch element M1 includes a gate electrode connected to a fourth gate line GL4 to which the EM signal EMn is applied, a first electrode connected to the first power line PL1 to which the pixel driving voltage ELVDD is applied, and a second electrode connected to the second node n2.

As one example, the second switch element M2 is connected between the data line DL to which the data voltage Vdata of the pixel data is applied and the second node n2. The second switch element M2 is turned on or off in response to a second scan signal SC2n, for example, the second switch element M2 is turned on in response to the gate-low voltage VGL of a second scan signal SC2n, and turned off in response to the gate-high voltage VGH of a second scan signal SC2n, but the present disclosure is not limited thereto. When the second switch element M2 is turned on, the data line DL to which the data voltage Vdata of the pixel data is applied is connected to the second node n2. The second switch element M2 includes a gate electrode connected to the second gate line GL2 to which the second scan signal SC2n is applied, a first electrode connected to the data line DL, and a second electrode connected to the second node n2.

As one example, the third switch element M3 is connected between the first node n1 and the third node n3. The third switch element M3 is turned on or off in response to the first-second scan signals SC1n, for example, the third switch element M3 is turned on in response to the gate-high voltage VGH of the first-second scan signals SC1n, and turned off in response to the gate-low voltage VGL of the first-second scan signals SC1n, but the present disclosure is not limited thereto. When the third switch element M3 is turned on, the first node n1 is connected to the third node n3. Therefore, when the third switch element M3 is turned on, the driving element DT operates as a diode with its gate electrode and the second electrode connected. The third switch element M3 includes a gate electrode connected to a first-second gate line GL11 to which the first-second scan signal SC1n is applied, a first electrode connected to the first node n1, and a second electrode connected to the third node n3.

As one example, the fourth switch element M4 is connected between the first node n1 and the third power line PL3 to which the initialization voltage Vint is applied. The fourth switch element M4 is turned on or off in response to t the first-first scan signal SC1n-i, for example, the fourth switch element M4 is turned on in response to the gate-high voltage VGH of the first-first scan signal SC1n-i, and turned off in response to the gate-low voltage VGL of the first-first scan signal SC1n-i, but the present disclosure is not limited thereto. When the fourth switch element M4 is turned on, the initialization voltage Vint is applied to the capacitor Cst and to the gate electrode of the driving element DT. The fourth switch element M4 includes a gate electrode connected to a first-first gate line GL1i to which the first-first scan signal SC1n-i is applied, a first electrode connected to the first node n1, and a second electrode connected to the third power line PL3.

As one example, the fifth switch element M5 is connected between the second node n2 and the fourth power line PLA to which the second compensation voltage VOBS is applied. The fifth switch element M5 is turned on or off in response to the third scan signal SC3n, for example, the fifth switch element M5 is turned on in response to the gate-low voltage VGL of the third scan signal SC3n, and turned off in response to the gate-high voltage VGH of the third scan signal SC3n, but the present disclosure is not limited thereto. When the fifth switch element M5 is turned on, the second compensation voltage VOBS is applied to the second node n2. The fifth switch element M5 includes a gate electrode connected to the third gate line GL3 to which the third scan signal SC3n is applied, a first electrode connected to the second node n2, and a second electrode connected to the fourth power line PL4.

As one example, the sixth switch element M6 is connected between the fourth node n4 and the fifth power line PL5 to which the third compensation voltage VAR is applied. The sixth switch element M6 is turned on or off in response to the third scan signal SC3n, for example, the sixth switch element M6 is turned on in response to the gate-low voltage VGL of the third scan signal SC3n, and turned off in response to the gate-high voltage VGH of the third scan signal SC3n, but the present disclosure is not limited thereto. When the sixth switch element M6 is turned on, the third compensation voltage VAR is applied to the anode electrode of the light-emitting element EL connected to the fourth node n4. The sixth switch element M6 includes a gate electrode connected to the third gate line GL3, a first electrode connected to the fourth node n4, and a second electrode connected to the fifth power line PL5 to which the third compensation voltage VAR is applied.

As one example, the seventh switch element M7 is connected between the third node n3 and the fourth node n4. The seventh switch element M7 turns on or off in response to the EM signal EMn, for example, the seventh switch element M7 turns on in response to the gate-low voltage VGL of the EM signal EMn and turns off in response to the gate-high voltage VGH of the EM signal EMn, but the present disclosure is not limited thereto. The seventh switch element M7 turns on in response to the gate-low voltage VGL of the EM signal EMn to connect the third node n3 to the fourth node n4. The seventh switch element M7 includes a gate electrode connected to the fourth gate line GL4, a first electrode connected to the third node n3, and a second electrode connected to the fourth node n4.

The data voltage Vdata of the pixel data is applied to the data lines DL during the refresh frame period when the pixel data is written to the pixels. The first compensation voltage Vpark is set to a voltage to compensate for changes in the luminance of the pixels and is applied to the data lines DL during the hold frame period when no pixel data is written to the pixels. During the hold frame, the pixels 101 are driven by the data voltage Vdata charged to the first capacitor Cst in a previous refresh frame.

The data voltage Vdata is applied to the second node n2 when the data line DL and the second node n2 are electrically connected through the turned-on second switch element M2. The first compensation voltage Vpark may be applied to the second node n2 as a leakage current of the second switch element M2 in the off-state of the second switch element M2, that is, in a state in which the data line DL and the second node n2 are electrically disconnected, and may be applied to the first node n1 by means of parasitic capacitance. Here, the parasitic capacitance may include a parasitic capacitance that exists between the first node n1 and the second node n2, and a parasitic capacitance that exists between the first node n1 and the data line DL. The gate-to-source voltage Vgs of the driving element DT may be finely tuned by the first compensation voltage Vpark.

The compensation voltages Vpark, VOBS, and VAR may compensate for differences in the luminance characteristics of the pixels 101 between the refresh frame and the hold frame in low power mode to improve the quality of the image reproduced from the pixels 101.

Figure 10A:
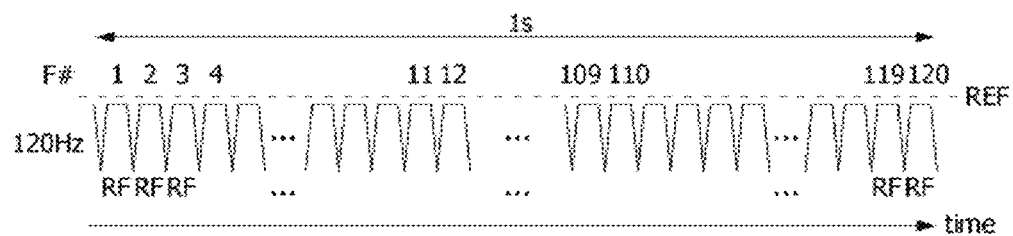
FIGS. 10A to 10E are waveform diagrams illustrating the luminance characteristics according to the driving frequency of the pixels and a compensation voltage according to an exemplary embodiment of the present disclosure.
Figure 10B:
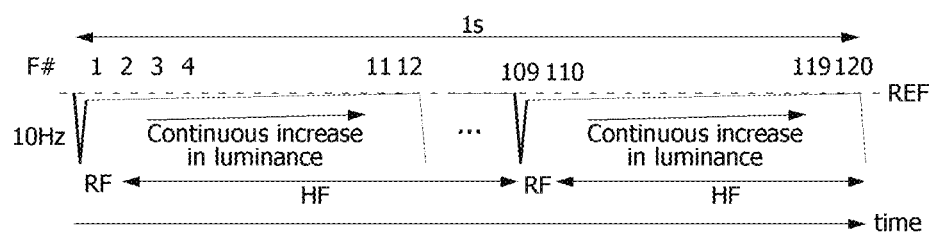
Figure 10C:
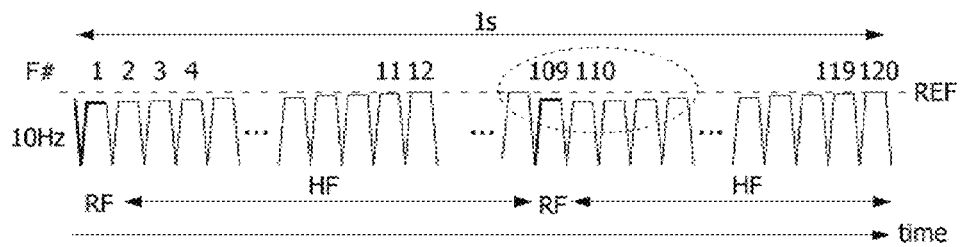
Figure 10D:
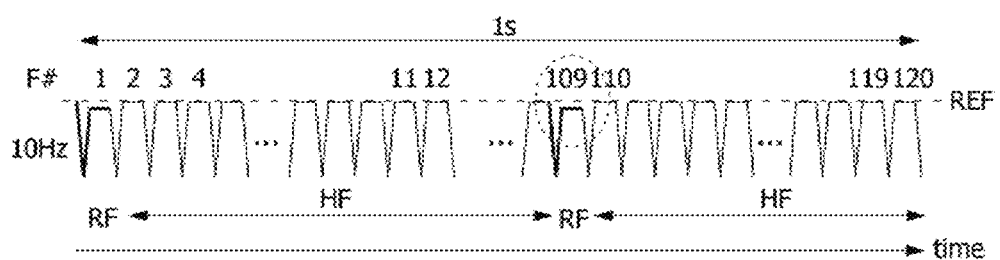
Figure 10E:
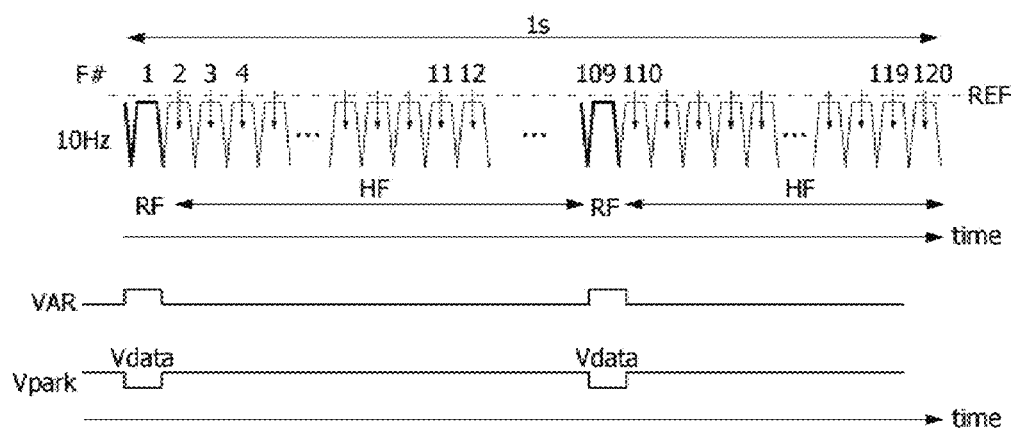

FIGS. 10A to 10E are waveform diagrams illustrating the luminance characteristics according to the driving frequency of the pixels and compensation voltage according to one embodiment. Flicker may be measured based on the amount of luminance change of a pixel on a time axis. FIGS. 10A to 10D illustrate the luminance characteristics of the pixels in which the flicker is measured in the pixels due to the changes in the threshold voltage characteristics of the driving element according to the changes in the driving frequency of the pixels when no compensation voltages Vpark, VOBS, and VAR are applied to the pixels. FIG. 10E illustrates the improvement in the luminance characteristics of the pixels when the first to third compensation voltages Vpark, VOBS, and VAR are applied to the pixels. In FIGS. 10A to 10E, "F #" indicates a frame number from a first frame to 120-th frame (1 to 120 frames). "REF" indicates a luminance reference value that represents the luminance of the pixels when a data voltage with the same white grayscale value is applied to the pixels. "RF" denotes the refresh frame period and "HF" denotes the hold frame period.

FIG. 10A illustrates the luminance characteristics of the pixels when they are driven at a refresh frame frequency of 120 Hz. In FIG. 10A, the pixels are supplied with a data voltage Vdata of pixel data at 120 Hz every frame. In this case, because the data voltage Vdata is applied every frame, the pixels are measured to have a constant luminance when the data voltage Vdata is the same, so the flicker is not visible. In this case, the flicker values of the pixels may be measured constantly as the same value.

FIG. 10B illustrates the luminance characteristics of the pixels when they are driven at a refresh frame frequency of 10 Hz. In FIG. 10B, the data voltage Vdata is applied to the pixels during the refresh frames (1, . . . 109) set to have time intervals of 12 frame periods in one second (1 s), and no data voltage Vdata is applied to the pixels during the hold frames (2-12, . . . 110-120) between the refresh frames. During the refresh frames (1, . . . 109), the luminance of the pixels may decrease, and during the hold frame periods (2~12, . . . 110~120), the threshold voltage Vth characteristic of the driving element DT may change, causing the luminance of the pixels to increase over time due to the change in the gate-to-source voltage Vgs. In this case, the luminance of the pixels fluctuates at a periodic rate of 10 Hz, so that a flicker of 10 Hz may be measured.

FIG. 10C illustrates the luminance characteristics of the pixels when they are driven at a refresh frame frequency of 10 Hz with an off duration every frame period. Here, the off duration is the time interval during which the light-emitting element EL is turned off by the gate-off voltage leg of the EM signal. In FIG. 10C, the data voltage Vdata is applied to the pixels during the refresh frames (1, . . . 109) set to have time intervals of 12 frame periods in one second (1 s), and no data voltage Vdata is applied to the pixels during the hold frames (2~12, . . . 110~120). During the refresh frames (1, . . . 109), the luminance of the pixels may decreases, and during the hold frame periods (2~12, . . . 110~120), and the luminance of the pixels may change due to the change in the gate-to-source voltage of the driving element DT. In this case, the luminance of the pixels fluctuates at a periodic rate of 10 Hz, so that a flicker of 10 Hz may be measured. In FIG. 10C, a dashed circle denotes the time period during which the luminance of the pixels changes.

FIG. 10D illustrates the luminance characteristics of the pixels when they are driven at a refresh frame frequency of 10 Hz with an off duration every frame period. In FIG. 10D, the data voltage Vdata is applied to the pixels during the refresh frames (1, . . . 109) set to have a time interval of 12 frame periods in one second (1 s), and no data voltage Vdata is applied to the pixels during the hold frames (2~12, . . . 110~120). During the periods of the refresh frames (1, . . . 109) and the hold frames (2~12, . . . 110~120), the second compensation voltage VOBS is applied to the second node n2 of the pixel circuit, which reduces or minimizes the luminance difference of the pixels during the periods of the hold frame periods (2~12, . . . 110~120).

FIG. 10E illustrates the luminance characteristics of the pixels when they are driven at a refresh frame frequency of 10 Hz with an off duration every frame period. In FIG. 10E, the data voltage Vdata is applied to the pixels during the refresh frames (1, . . . 109) set to have time intervals of 12 frame periods in one second (1 s), and no data voltage Vdata is applied to the pixels during the hold frames (2~12, . . . 110~120). During the periods of the hold frames (2~12, . . . 110~120), when the first to third compensation voltages Vpark, VOBS, and VAR are applied to the pixel circuit, the luminance difference of the pixels between the periods of the refresh frames (1, . . . 109) and the hold frames (2~12, . . . 110~120) is further reduced or minimized. In this case, the luminance difference of the pixels may be minimized such that no flicker is measured during the periods of the refresh frames (1, . . . 109) and the hold frames (2~12, . . . 110~120).

The first compensation voltage Vpark is applied to the data line DL during the hold frames (2~12, . . . 110~120). The second and third compensation voltages VOBS and VAR may be generated as alternating voltages that changes between the refresh frame RF and the hold frame HF and applied to the power lines PL4 and PL5.

FIG. 11 is a waveform diagram illustrating the gate signals and the data voltages generated during the refresh frame RF according to one embodiment. FIGS. 12A to 12D are circuit diagrams illustrating the operation of the pixel circuit during the refresh frame RF in stages according to one embodiment.

Referring to FIG. 11, the driving period of the pixels may be divided into a first on-bias period OBS1, a first initialization period PRE, a second initialization period INI, a sampling period SAM, a second on bias period OBS2, and an emission period EMI during the refresh frame RF. A first floating period Tf1 may be set between the first on-bias period OBS1 and the first initialization period PRE but the present disclosure is not limited thereto. A second floating period Tf2 may be set between the sampling period SAM and the second on-bias period OBS2 but the present disclosure is not limited thereto. A third floating period Tf3 may be set between the second on-bias period OBS2 and the emission period EMI but the present disclosure is not limited thereto.

During the first on-bias period OBS1, the voltage of the first and third scan signals SC1n for controlling the turning-on and off of the third switch element M3, SC1n-i for controlling the turning-on and off of the fourth switch element M4, and SC3n for controlling the turning-on and off of the fifth and sixth switch elements M5 and M6 is the gate-low voltage VGL, and the voltage of the second scan signal SC2n for controlling the turning-on and off of the second switch element M2 is the gate-high voltage VGH, but the present disclosure is not limited thereto. The voltage of the EM signal EMn for controlling the turning-on and off of the first and seventh switch elements M1 and M7 is the gate-high voltage VGH during the first on-bias period OBS1. Therefore, during the first on-bias period OBS1, the fifth and sixth switch elements M5 and M6 are turned on, as shown in FIG. 12A, to apply the second compensation voltage VOBS to the second node n2 and the third compensation voltage VAR to the fourth node n4.

Figure 12A:
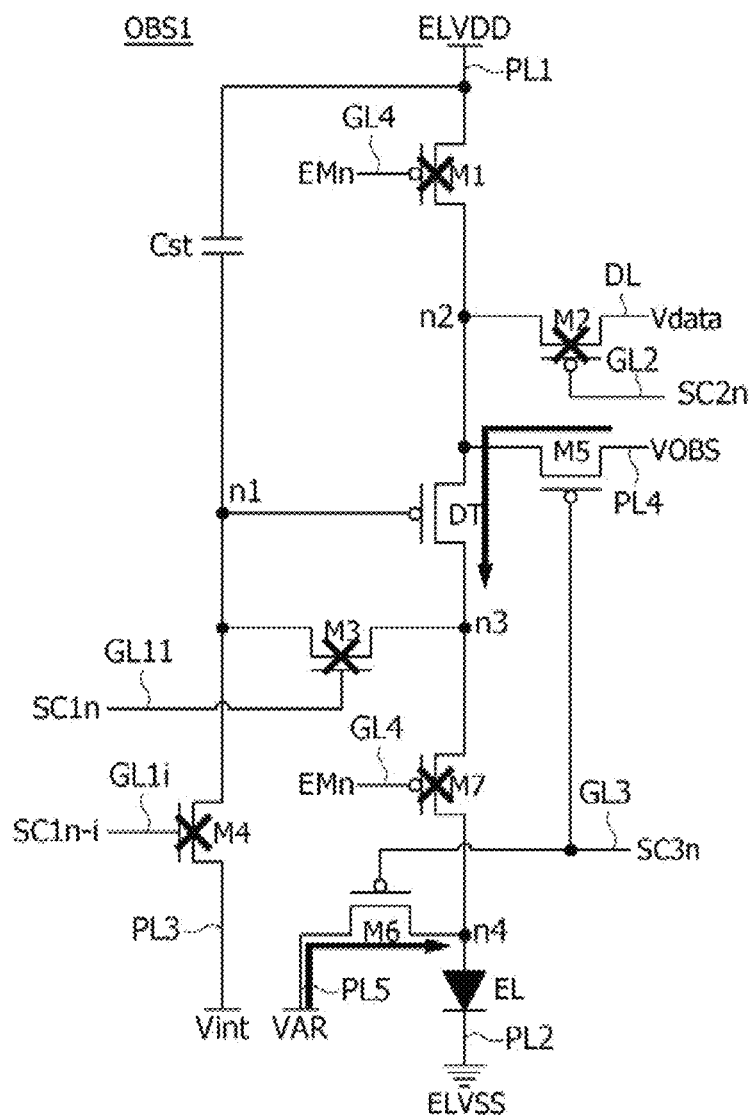
FIG. 12A is a circuit diagram illustrating an operation of a pixel circuit during a first on-bias period of a refresh frame according to an exemplary embodiment of the present disclosure.

During the first on-bias period OBS1, the first, second, third, fourth, and seventh switch elements M1, M2, M3, M4, and M7 is in the off-state, as shown in FIG. 12A. During the first on-bias period OBS1, the driving element DT may be turned on because the on-bias voltage is applied to it, but no current may be supplied to the light-emitting elements EL because the seventh switch element M7 is in the off-state. In addition, the light-emitting elements EL do not emit light during the first on-bias period OBS1 because the voltage difference between the third compensation voltage VAR and the cathode voltage ELVSS is less than the threshold voltage of the light-emitting element EL.

During the first on-bias period OBS1, the voltage of the second and third nodes n2 and n3 is the second compensation voltage VOBS, and the voltage of the fourth node n4 is the third compensation voltage VAR. In this case, the voltage of the first node n1 may be a voltage of Vdata+Vth obtained by adding the threshold voltage Vth of the driving element DT to the previously stored data voltage Vdata.

During the first floating period Tf1, the voltage of the first scan signals Sc1n for controlling the turning-on and off of the third switch element M3 and SC1n-i for controlling the turning-on and off of the fourth switch element M4 is the gate-low voltage VGL, and the voltage of the second and third scan signals Sc2n for controlling the turning-on and off of the second switch element M2 and Sc3n for controlling the turning-on and off of the fifth and sixth switch elements M5 and M6 is the gate-high voltage VGH. The voltage of the EM signal EMn for controlling the turning-on and off of the first and seventh switch elements M1 and M7 is the gate-high voltage VGH during the first floating period Tf1. Therefore, during the first floating period Tf1, the first to fourth nodes n1, n2, n3, and n4 are floated to maintain their previous state because the first to seventh switch elements M1 to M7 are all in the off-state.

Figure 12B:
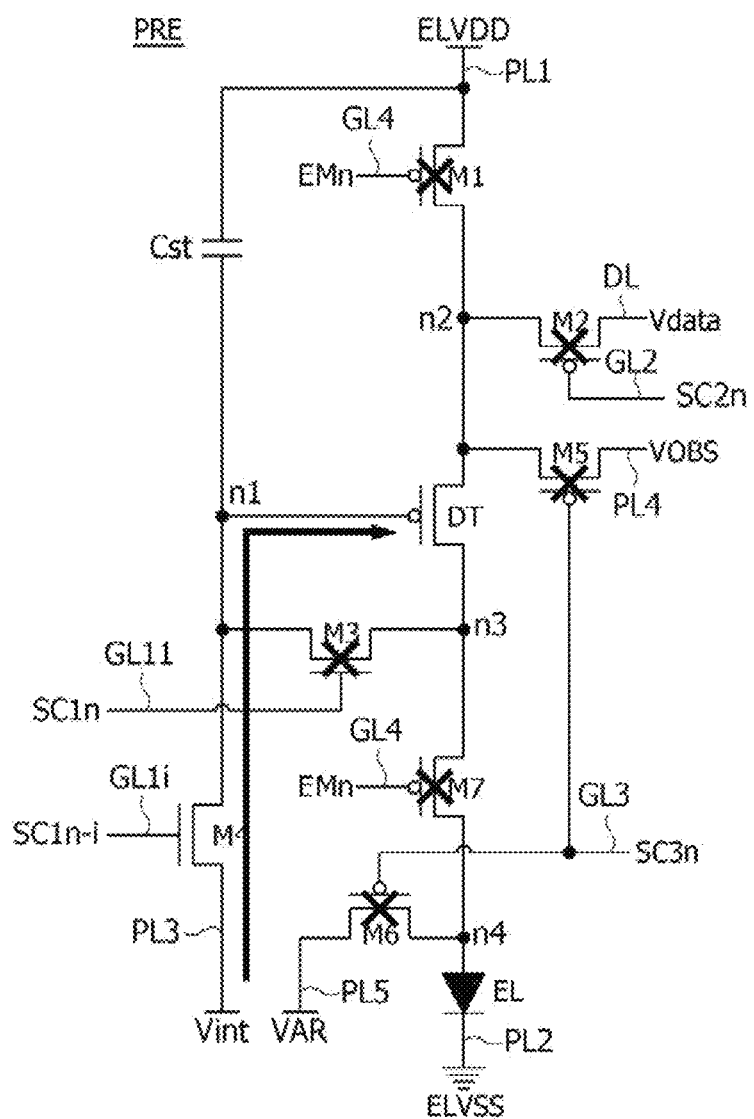
FIG. 12B is a circuit diagram illustrating an operation of a pixel circuit during a first initialization period of a refresh frame according to an exemplary embodiment of the present disclosure.
Figure 12C:
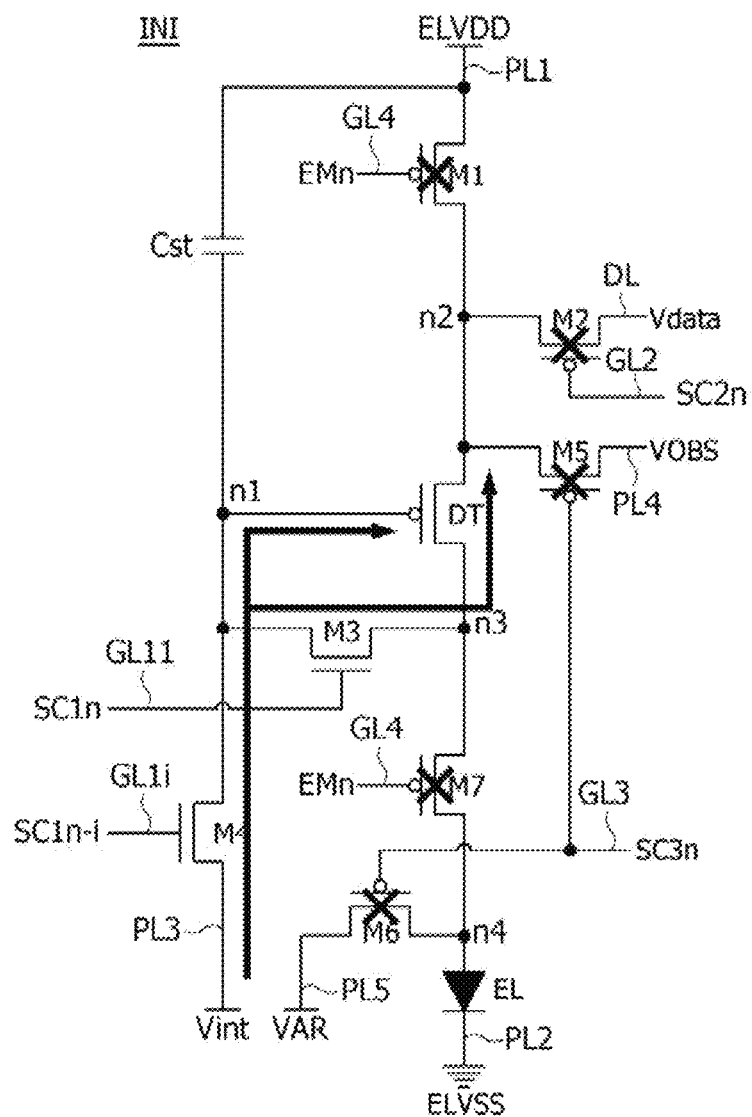
FIG. 12C is a circuit diagram illustrating an operation of a pixel circuit during an initialization period of a refresh frame according to an exemplary embodiment of the present disclosure.

During the first initialization period PRE, the voltages of the first-first scan signal SC1n-i for controlling the turning-on and off of the fourth switch element M4, the second scan signal SC2n for controlling the turning-on and off of the second switch element M2, and the third scan signal SC3n for controlling the turning-on and off of the fifth and sixth switch elements M5 and M6 are the gate-high voltages VGH, while the voltage of the first-second scan signal SC1n for controlling the turning-on and off of the third switch element M3 is the gate-low voltages VGL. Therefore, during the first initialization period PRE, the fourth switch element M4 is turned on, as shown in FIG. 12B, to apply the initialization voltage Vint to the first node n1. During the first initialization period PRE, the gate-to-source voltage Vgs of the driving element DT may increase, and thus the on-bias voltage may be applied to the driving element DT.

During the first initialization period PRE, the light-emitting element EL is in the off-state and do not emit light.

During the second initialization period INI, the voltage of the first to third scan signals SC1n for controlling the turning-on and off of the third switch element M3, SC1n-i for controlling the turning-on and off of the fourth switch element M4, SC2n for controlling the turning-on and off of the second switch element M2, and SC3n for controlling the turning-on and off of the fifth and sixth switch elements M5 and M6 and the EM signal EMn for controlling the turning-on and off of the first and seventh switch elements M1 and M7 is the gate-high voltage VGH. Therefore, during the second initialization period INI, the third and fourth switch elements M3 and M4 are turned on to apply the initialization voltage Vint to the first and third nodes n1 and n3, and the initialization voltage Vint is also applied to the second node n2 through the driving element DT, which remains in the on-state. During the second initialization period INI, the light-emitting element EL is in the off-state and do not emit light. During the second initialization period INI, the fourth node n4 is floated to maintain its previous state because the sixth and seventh switch elements M6 and M7 are in the off-state.

Figure 12D:
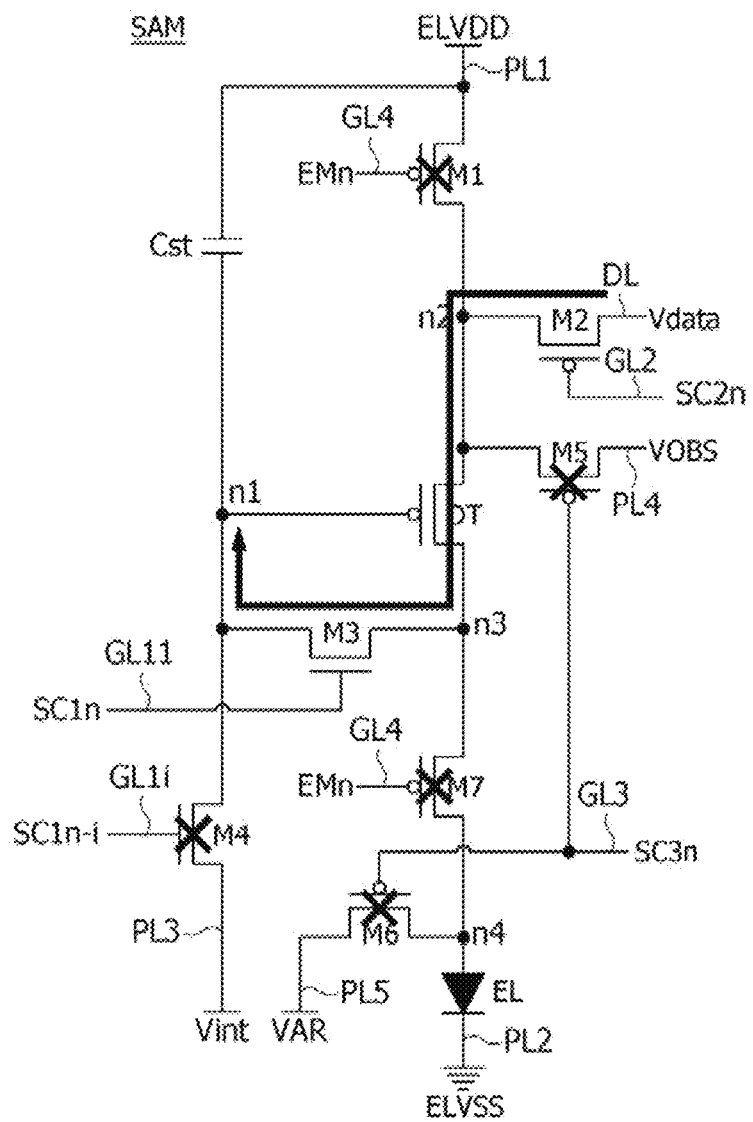
FIG. 12D is a circuit diagram illustrating an operation of a pixel circuit during a sampling period of a refresh frame according to an exemplary embodiment of the present disclosure.

During the sampling period SAM, the voltage of the second scan signal SC2n for controlling the turning-on and off of the second switch element M2 is generated as a pulse of the gate-low voltage VGL synchronized with the data voltage Vdata of the pixel data, and then inverted to the gate-high voltage VGH. The pulse width of the second scan signal SC2n may be one horizontal period. During the sampling period SAM, the voltage of the first-second scan signal SC1n for controlling the turning-on and off of the third switch element M3, the third scan signal SC3n for controlling the turning-on and off of the fifth and sixth switch elements M5 and M6, and the EM signal EMn for controlling the turning-on and off of the first and seventh switch elements M1 and M7 is the gate-high voltage VGH, and the voltage of the first-first scan signal SC1n-i for controlling the turning-on and off of the fourth switch element M4 is the gate-low voltage VGL, and the second scan signal SC2n for controlling the turning-on and off of the second switch element M2 is the gate-low voltage VGL. During the sampling period SAM, the second and three switch elements M2 and M3 are in the on-state, and the first, fourth, fifth, sixth to seventh switch elements M1, M4, M5, M6-M7 are in the off-state, as shown in FIG. 12D. When the second switch element M2 is turned on in response to the gate-low voltage of the scan pulse in the sampling period SAM, the data voltage Vdata is applied to the second node n2, and when the third switch element M3 is turned on in response to the gate-high voltage of the first-second scan signal SC1n, the data voltage Vdata is also applied to the first and third nodes n1 and n3 through the driving element DT in the on-state, as shown in FIG. 12D. In this case, the voltage of the second node n2 is the data voltage Vdata, and the voltage of each of the second and third nodes n1 and n3 is a voltage of Vdata+Vth, which is obtained by adding the threshold voltage Vth of the driving element DT to the data voltage Vdata. During the sampling period SAM, the fourth node n4 is in a floating state and the light-emitting element EL is in the off-state and thus not emit light.

During the second floating period Tf2, the voltage of the first scan signals Sc1n for controlling the turning-on and off of the third switch element M3 and SC1n-i for controlling the turning-on and off of the fourth switch element M4 is the gate-low voltage VGL, and the voltage of the second and third scan signals Sc2n for controlling the turning-on and off of the second switch element M2 and Sc3n for controlling the turning-on and off of the fifth and sixth switch elements M5 and M6 is the gate-high voltage VGH. The voltage of the EM signal EMn for controlling the turning-on and off of the first and seventh switch elements M1 and M7 is the gate-high voltage VGH during the second floating period Tf2. During the second floating period Tf2, the first to seventh switch elements M1 to M7 are all in the off-state. Therefore, during the second floating period Tf2, the first to fourth nodes n1, n2, n3, and n4 are floated to maintain their previous states because the first to seventh switch elements M1 to M7 are all in the off-state.

During the second on-bias period OBS2, the voltage of the first and third scan signals SC1n for controlling the turning-on and off of the third switch element M3, SC1n-i for controlling the turning-on and off of the fourth switch element M4, and SC3n for controlling the turning-on and off of the fifth and sixth switch elements M5 and M6 is the gate-low voltage VGL, and the voltage of the second scan signal SC2n for controlling the turning-on and off of the second switch element M2 is the gate-high voltage VGH. The voltage of the EM signal EMn for controlling the turning-on and off of the first and seventh switch elements M1 and M7 is the gate-high voltage VGH during the second on-bias period OBS2. Therefore, during the second on-bias period OBS2, the fifth and sixth switch elements M5 and M6 are turned on, causing the second compensation voltage VOBS to be applied to the second node n2 and the third compensation voltage VAR to be applied to the fourth nodes n4, as shown in FIG. 12E.

Figure 12E:
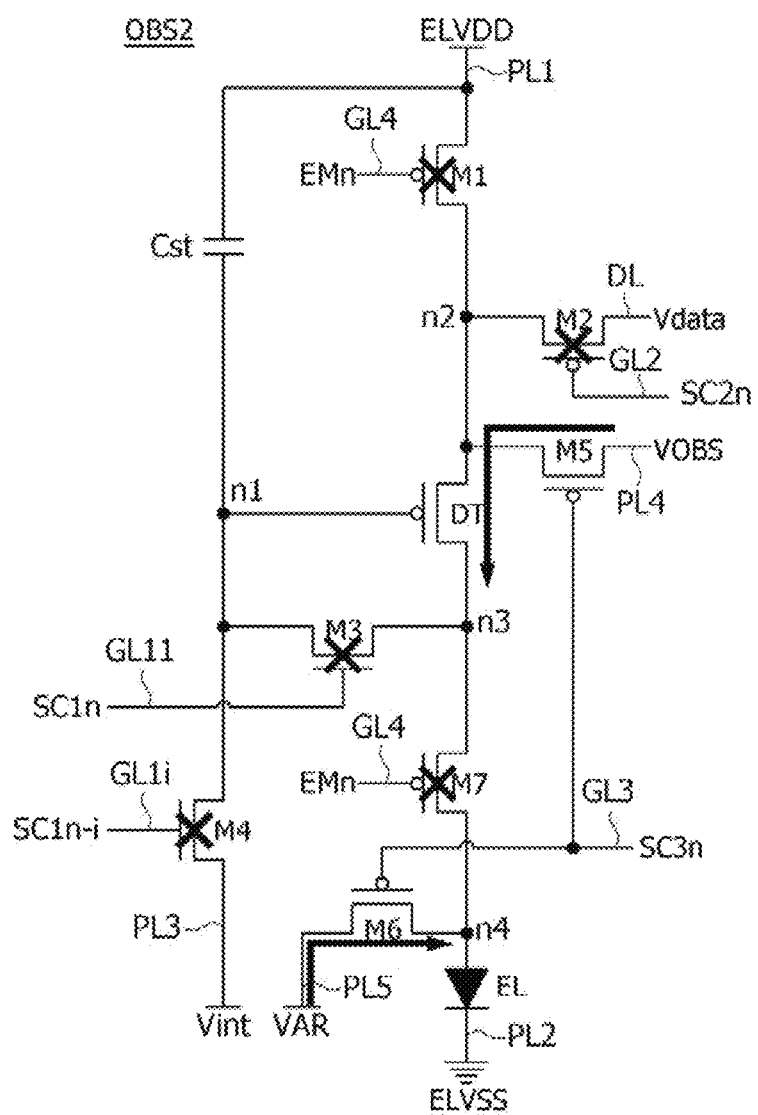
FIG. 12E is a circuit diagram illustrating the operation of a pixel circuit during a second on-bias period of a refresh frame according to an exemplary embodiment of the present disclosure.

During the second on-bias period OBS2, the first, second, third, fourth, and seventh switch elements M1, M2, M3, M4, and M7 is in the off-state, as shown in FIG. 12E. During the second on-bias period OBS2, the on-bias voltage is applied to the driving element DT. During the second on-bias period OBS2, no current may be supplied to the light-emitting element EL because the seventh switch element M7 is in the off-state, and the light-emitting element EL does not emit light because the voltage difference between the third compensation voltage VAR and the cathode voltage ELVSS is less than the threshold voltage of the light-emitting element EL. In this case, the voltage of the first node n1 may be a voltage of Vdata+Vth.

During the third floating period Tf3, the voltage of the first scan signals Sc1n for controlling the turning-on and off of the third switch element M3 and SC1n-i for controlling the turning-on and off of the fourth switch element M4 is the gate-low voltage VGL, and the voltage of the second and third scan signals Sc2n for controlling the turning-on and off of the second switch element M2 and Sc3n for controlling the turning-on and off of the fifth and sixth switch elements M5 and M6 is the gate-high voltage VGH. The voltage of the EM signal EMn for controlling the turning-on and off of the first and seventh switch elements M1 and M7 is the gate-high voltage VGH during the third floating period Tf3. During the third floating period Tf3, the first to seventh switch elements M1 to M7 are all in the off-state. Therefore, during the third floating period Tf3, the first to fourth nodes n1, n2, n3, and n4 are floated to maintain their previous states because the first to seventh switch elements M1 to M7 are all in the off-state.

Figure 12F:
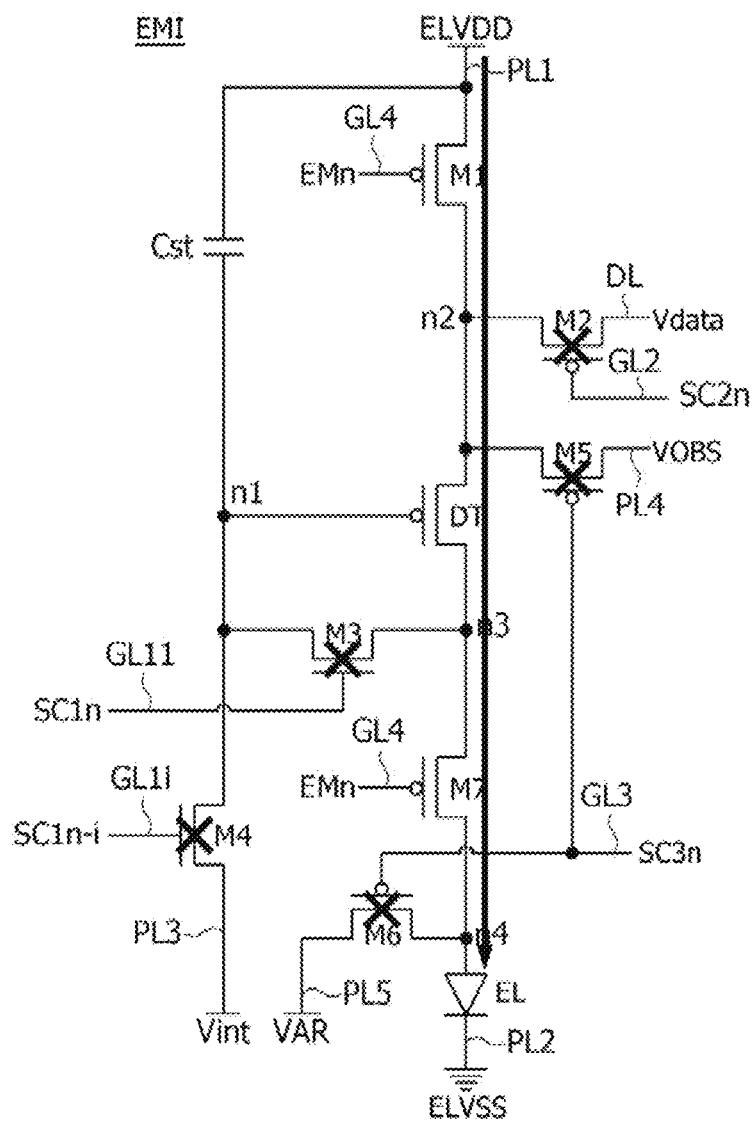
FIG. 12F is a circuit diagram illustrating an operation of a pixel circuit during an emission period of a refresh frame according to an exemplary embodiment of the present disclosure.

During the emission period EMI of the refresh frame RF, the voltage of the first scan signals Sc1n for controlling the turning-on and off of the third switch element M3 and SC1n-i for controlling the turning-on and off of the fourth switch element M4 and the EM signal EMn for controlling the turning-on and off of the first and seventh switch elements M1 and M7 is the gate-low voltage VGL, and the voltage of the second and the third scan signal Sc2n for controlling the turning-on and off of the second switch element M2 and SC3n for controlling the turning-on and off of the fifth and sixth switch elements M5 and M6 is the gate-high voltage VGH. During the emission period EMI, the first and seventh switch elements M1 and M7 is turned on in response to the gate-low voltage VGL of the EM signal EMn, as shown in FIG. 12F. Therefore, a current path is formed between the pixel driving voltage ELVDD and the light-emitting element EL during the emission period EMI.

During the emission period EMI, a current, which is determined according to the gate-source voltage Vgs of the driving element DT, flows through the light-emitting element EL so that the light-emitting element EL may emit light at a luminance corresponding to the grayscale value of the pixel data. During the emission period EMI, the second to sixth switch elements M2 to M6 are in the off-state, as shown in FIG. 12F.

Figure 14A:
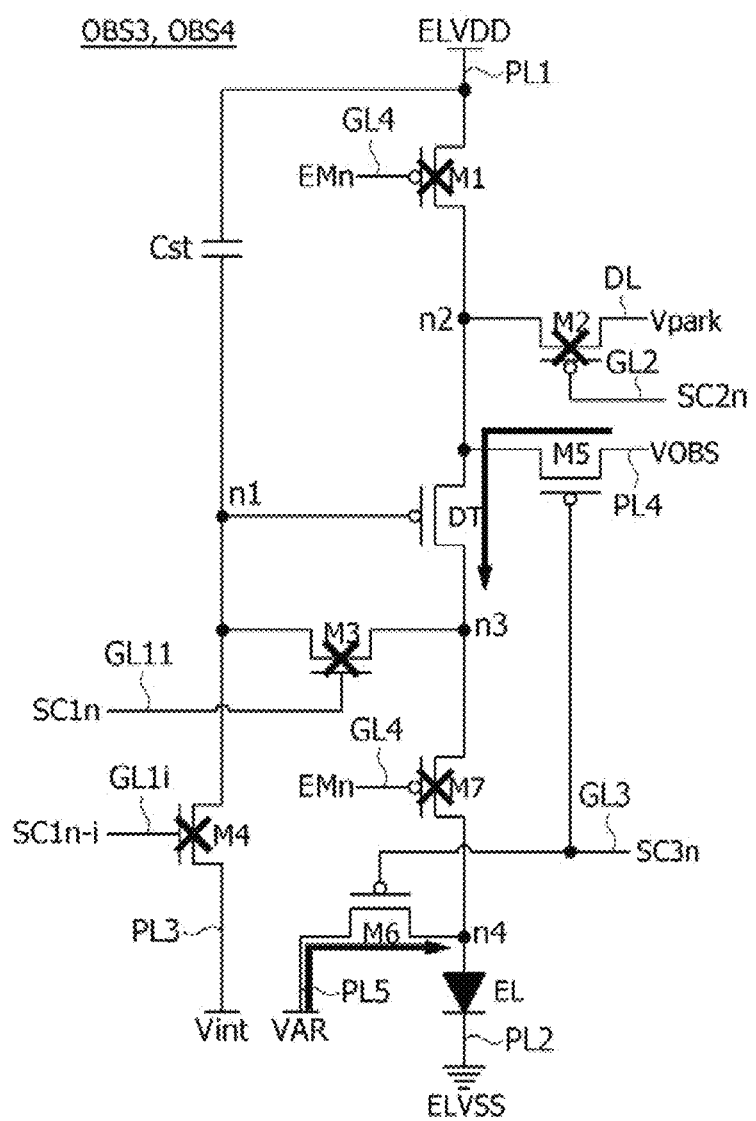
FIG. 14A is a circuit diagram illustrating an operation of a pixel circuit during an on-bias period of a hold frame according to an exemplary embodiment of the present disclosure.
Figure 14B:
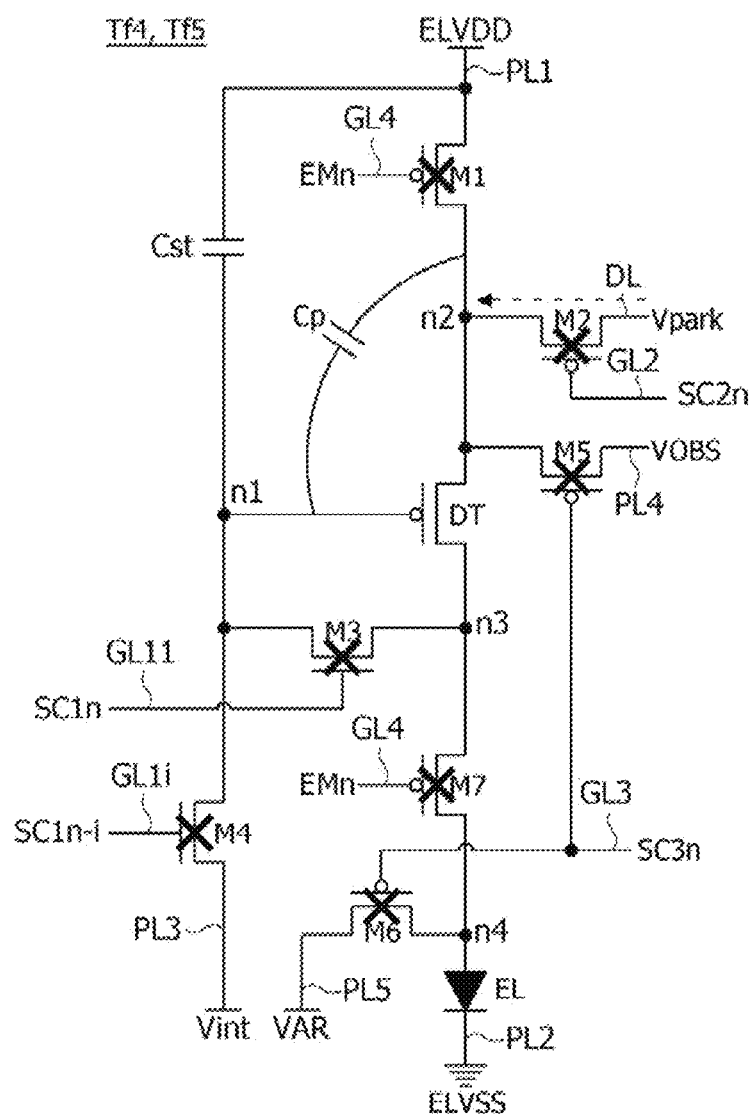
FIG. 14B is a circuit diagram illustrating an operation of a pixel circuit during a floating period of a hold frame according to an exemplary embodiment of the present disclosure.
Figure 14C:
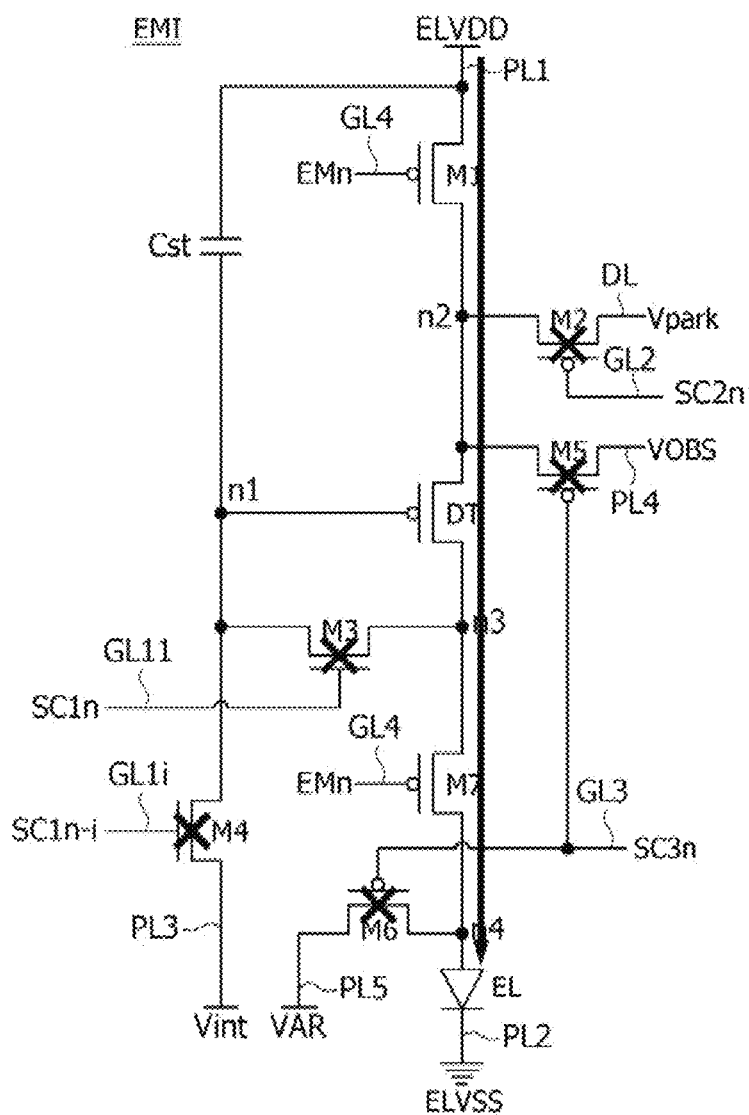
FIG. 14C is a circuit diagram illustrating an operation of a pixel circuit during an emission period of a refresh frame according to an exemplary embodiment of the present disclosure.

FIG. 13 is a waveform diagram illustrating the gate signals and the first compensation voltage generated during the hold frame HF according to one embodiment. FIGS. 14A to 14C are circuit diagrams illustrating the operation of the pixel circuit during the refresh frame HF in stages according to one embodiment.

Referring to FIG. 13, the driving period of the pixels may be divided into a third on-bias period OBS3, a fourth on-bias period OBS4, and an emission period EMI during the hold frame HF, but the present disclosure is not limited thereto. Further, a fourth floating period Tf4 may be set between the third on-bias period OBS3 and the fourth on-bias period OBS4. Further, a fifth floating period Tf5 may be set between the fourth on-bias period OBS4 and the emission period EMI.

The data driver 110 does not output the data voltage Vdata during the hold frame HF. In the hold frame HF, the first compensation voltage Vpark is applied to the data lines DL.

In the hold frame HF, the voltage of the first scan signals Sc1n for controlling the turning-on and off of the third switch element M3 and SC1n-i for controlling the turning-on and off of the fourth switch element M4 is held at the gate-low voltage VGL, and the voltage of the second scan signal SC2n for controlling the turning-on and off of the second switch element M2 is held at the gate-high voltage VGH. Therefore, the second, third, and fourth switch elements M2, M3, and M4 in the pixel circuit remain in the off-state during the hold frame HF. In the gate driver 120, the first and second shift registers have very low power consumption because they do not output pulses during the hold frame HF. During the hold frame HF, the pixel circuit may be driven by the capacitor voltage stored during the previous refresh frame RF.

During the third on-bias period OBS3, the voltage of the first and third scan signals SC1n for controlling the turning-on and off of the third switch element M3, SC1n-i for controlling the turning-on and off of the fourth switch element M4, and SC3n for controlling the turning-on and off of the fifth and sixth switch elements M5 and M6 is the gate-low voltage VGL, and the voltage of the second scan signal SC2n for controlling the turning-on and off of the second switch element M2 is the gate-high voltage VGH. The voltage of the EM signal EMn for controlling the turning-on and turning-off of the first and seventh switch elements M1 and M7 is the gate-high voltage VGH during the third on-bias period OBS3. Therefore, during the third on-bias period OBS3, the fifth and sixth switch elements M5 and M6 are turned on, as shown in FIG. 14A, to apply the second compensation voltage VOBS to the second node n2 and the third compensation voltage VAR to the fourth node n4. During the third on-bias period OBS3, the first, second, third, fourth, and seventh switch elements M1, M2, M3, M4, and M7 is in the off-state, as shown in FIG. 14A. During the third on-bias period OBS3, the voltage of the first node n1 is held at a voltage of Vdata+Vth, and the light-emitting element EL does not emit.

During the fourth floating period Tf4, the voltage of the first scan signals Sc1n for controlling the turning-on and off of the third switch element M3 and SC1n-I for controlling the turning-on and off of the fourth switch element M4 is the gate-low voltage VGL, and the voltage of the second and third scan signals Sc2n for controlling the turning-on and off of the second switch element M2 and Sc3n for controlling the turning-on and off of the fifth and sixth switch elements M5 and M6 is the gate-high voltage VGH. The voltage of the EM signal eMn for controlling the turning-on and off of the first and seventh switch elements M1 and M7 is the gate-high voltage VGH during the fourth floating period Tf4. During the fourth floating period Tf4, the first to seventh switch elements M1 to M7 are all in the off-state, as shown in FIG. 14B. Therefore, during the fourth floating period Tf4, the first to fourth nodes n1, n2, n3, and n4 are floated to maintain their previous states because the first to seventh switch elements M1 to M7 are all in the off-state, as shown in FIG. 14B.

During the fourth on-bias period OBS4, the voltage of the first and third scan signals SC1n for controlling the turning-on and off of the third switch element M3, SC1n-i for controlling the turning-on and off of the fourth switch element M4, and SC3n for controlling the turning-on and off of the fifth and sixth switch elements M5 and M6 is the gate-low voltage VGL, and the voltage of the second scan signal SC2n for controlling the turning-on and off of the second switch element M2 is the gate-high voltage VGH. The voltage of the EM signal eMn for controlling the turning-on and turning-off of the first and seventh switch elements M1 and M7 is the gate-high voltage VGH during the fourth on-bias period OBS4. Therefore, during the fourth on-bias period OBS4, the fifth and sixth switch elements M5 and M6 are turned on, as shown in FIG. 14A, to apply the second compensation voltage VOBS to the second node n2 and the third compensation voltage VAR to the fourth node n4. During the fourth on-bias period OBS4, the first, second, third, fourth, and seventh switch elements M1, M2, M3, M4, and M7 is in the off-state, as shown in FIG. 14A. During the fourth on-bias period OBS4, the voltage of the first node n1 is held at a voltage of Vdata+Vth, and the light-emitting element EL does not emit.

During the fifth floating period Tf5, the voltage of the first scan signals Sc1n for controlling the turning-on and off of the third switch element M3 and SC1n-i for controlling the turning-on and off of the fourth switch element M4 is the gate-low voltage VGL, and the voltage of the second and third scan signals Sc2n for controlling the turning-on and off of the second switch element M2 and Sc3n for controlling the turning-on and off of the fifth and sixth switch elements M5 and M6 is the gate-high voltage VGH. The voltage of the EM signal EMn for controlling the turning-on and off of the first and seventh switch elements M1 and M7 is the gate-high voltage VGH during the fifth floating period Tf5. During the fifth floating period Tf5, the first to seventh switch elements M1 to M7 are all in the off-state, as shown in FIG. 14B. Therefore, during the fifth floating period Tf5, the first to fourth nodes n1, n2, n3, and n4 are floated to maintain their previous states because the first to seventh switch elements M1 to M7 are all in the off-state, as shown in FIG. 14B.

The first compensation voltage Vpark is supplied to the data lines DL during the hold frame HF. Because the second compensation voltage VOBS is applied to the second node n2 through the turned-on fifth switch element M5 during the on-bias periods OBS3 and OBS4 of the hold frame HF, the first compensation voltage Vpark has little effect on the first and second nodes n1 and n2 during the on-bias periods OBS1 and OBS2.

During the floating periods Tf4 and Tf5 of the hold frame HF, the second compensation voltage VOBS is not applied to the second node n2 because all of the switch elements M1 to M7 in the pixel circuit are in the off-state. During the floating periods Tf4 and Tf5 of the hold frame HF, as shown in FIG. 14B, the first compensation voltage Vpark may affect the voltages of the first and second nodes n1 and n2 of the pixel circuit, thereby allowing the luminance of the pixel to be appropriately adjusted.

The first compensation voltage Vpark changes the voltage of the second node n2 by means of the leakage current of the second switch element M2. In addition, the first compensation voltage Vpark affects the voltage of the first node n1 by means of the parasitic capacitance (Cp) between the first node n1 and the second node n2 to change the voltage of the first node n1. This first compensation voltage Vpark may reduce or minimize the luminance difference of the pixels between the refresh frame RF and the hold frame HF, as shown in FIG. 10E.

During the emission period EMI of the hold frame HF, the voltage of the first scan signals SC1n for controlling the turning-on and off of the third switch element M3, SC1n-i for controlling the turning-on and off of the fourth switch element M4 and the EM signal EMn for controlling the turning-on and off of the first and seventh switch elements M1 and M7 is the gate-low voltage VGL, and the voltage of the second and the third scan signal Sc2n for controlling the turning-on and off of the second switch element M2 and SC3n for controlling the turning-on and off of the fifth and sixth switch elements M5 and M6 is the gate-high voltage VGH. During the emission interval EMI, the first and seventh switch elements M1 and M7 are turned on in response to the gate-low voltage VGL of the EM signal EMn, as shown in FIG. 14C. Therefore, as shown in FIG. 14C, a current path is formed between the pixel driving voltage ELVDD and the light-emitting element EL during the emission period EMI. During the emission period EMI, the light-emitting element EL may be emitted by the current generated according to the gate-to-source voltage Vgs of the driving element DT stored in the capacitor Cst.

In the refresh frame RF, during the first initialization period PRE, the on-bias voltage may be applied to the driving element DT to increase the gate-to-source voltage Vgs of the driving element DT. In this case, there may be a difference in the luminance of the pixels 101 between the refresh frame RF and the hold frame HF. The second compensation voltage VOBS may be varied as shown in FIG. 15 to ensure that the luminance characteristics of the pixels are the same between the refresh frame RF and the hold frame HF.

Figure 15:
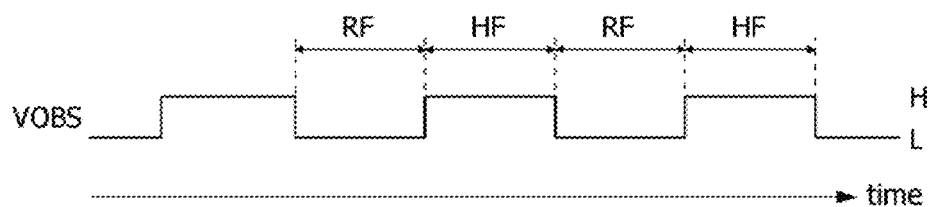
FIG. 15 is a waveform diagram illustrating an example where a compensation voltage is varied according to an exemplary embodiment of the present disclosure.

Referring to FIG. 15, the voltage of the second compensation voltage VOBS may be applied to the pixels 101 at a low voltage (L) during the refresh frame RF, and may be applied to the pixels 101 at a high voltage (H) during the hold frame HF. While the gate-to-source voltage Vgs of the driving element DT is higher in the refresh frame RF than in the hold frame HF, if the second compensation voltage VOBS is lower in the refresh frame RF than in the hold frame HF, the gate-to-source voltage Vgs of the driving element DT may be lower, and thus the luminance characteristics of the pixels are same in both the refresh frame RF and the hold frame HF are the same. For example, the second compensation voltage VOBS may be, but is not limited to, 4V in the refresh frame RF and 5V in the hold frame HF.

Figure 16:
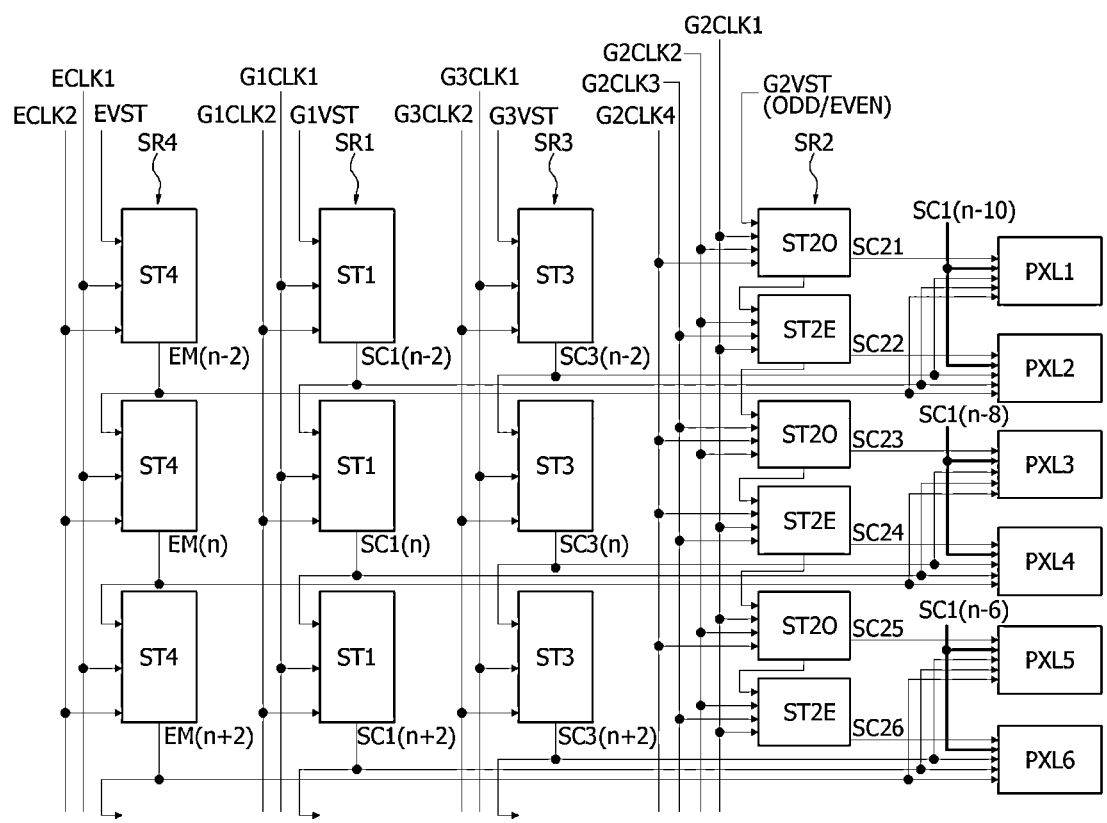
FIG. 16 is a diagram illustrating a gate driver for outputting the gate signals applied to the pixel circuit shown in FIGS. 9A and 9B according to an exemplary embodiment of the present disclosure.
Figure 17:
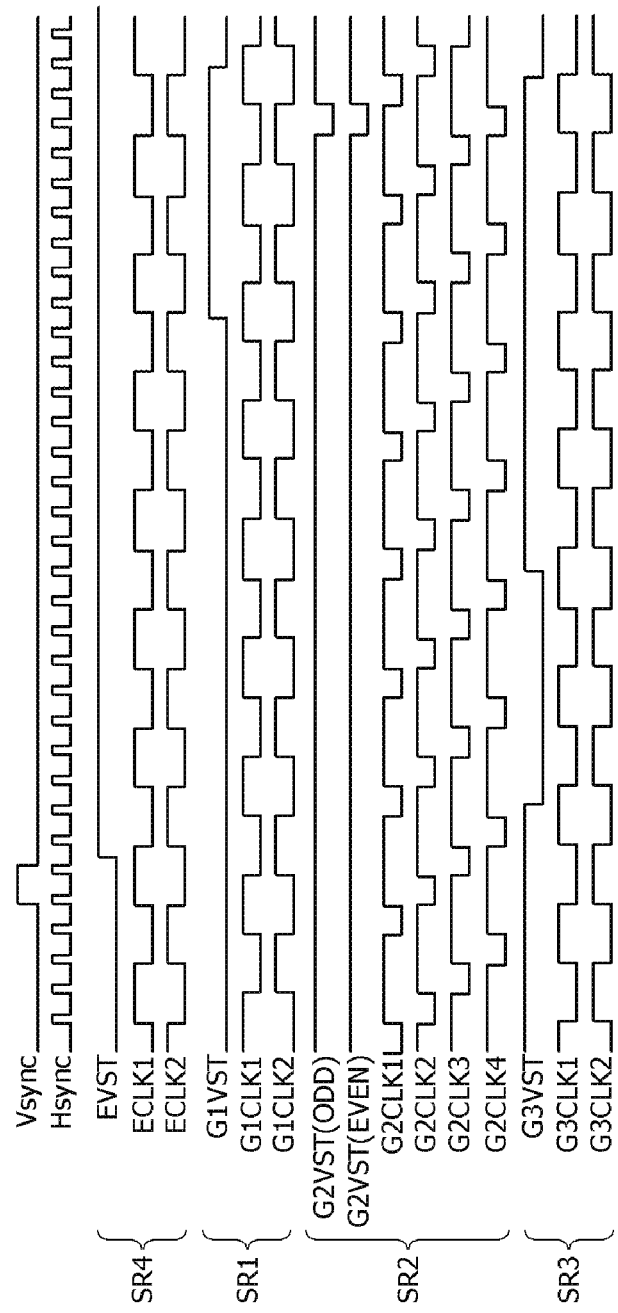
FIG. 17 is a waveform diagram illustrating a clock and a start pulse input to the shift register shown in FIG. 16 according to an exemplary embodiment of the present disclosure.

FIG. 16 is a diagram illustrating a gate driver for outputting the gate signals applied to the pixel circuit shown in FIGS. 9A and 9B according to one embodiment. FIG. 17 is a waveform diagram illustrating a clock and a start pulse input to the shift register shown in FIG. 16 according to one embodiment.

Referring to FIGS. 9A, 9B, 16, and 17, the gate driver 120 may include a first shift register SR1 that sequentially outputs a pulse of the first scan signals Sc1n-i and SC1n, a second shift register SR2 that sequentially outputs a pulse of the second scan signal SC2n, and a third shift register SR3 that sequentially outputs a pulse of the third scan signal SC3n, and a fourth shift register SR4 that outputs a pulse of the EM signal EMn.

The first shift register SR1 includes a plurality of signal transmission parts ST1 connected in cascade. The first shift register SR1 receives a start pulse G1VST and clocks G1CLK1, G1CLK2 and sequentially outputs the pulse of the first scan signals Sc1n-i and Sc1n. The clocks G1CLK1 and G1CLK2 may include two or more shift clocks with different phases. The first scan signals Sc1n-i and SC1n may have a pulse width set to be wider than one horizontal period, as shown in FIG. 11, and may be applied simultaneously to the pixels 101 disposed on the plurality of pixel lines. For example, a first-first scan signal SC1(n−10) and a first-second scan signal SC1(n−2) may be applied simultaneously to first and second pixels PXL1 and PXL2 that are vertically adjacent to each other. Subsequently, a first-first scan signal SC1(n−8) and a first-second scan signal SC1(n) may be simultaneously applied to third and fourth pixels PXL3 and PXL4 that are vertically adjacent to each other. Subsequently, a first-first scan signal SC1(n−6) and a first-second scan signal SC1(n+2) may be applied simultaneously to fifth and sixth pixels PXL5, PXL6 that are vertically adjacent to each other.

In order to adjust the luminance difference between the pixel lines, the pulses of the second scan signals SC21, SC23, and SC25 applied to the odd-numbered pixel lines and the pulses of the second scan signals SC22, SC24, and SC26 applied to the even-numbered second pixel lines may be adjusted differently from each other in their timing such as the phase, pulse width, or the like. To this end, the second shift register SR2 may include a plurality of odd-numbered shift registers ST2O that receive a first start pulse G2VST (ODD) and the first clocks G2CLK1, G2CLK2 and sequentially output the pulses of the odd-numbered scan signals SC21, SC23, and SC25, and a plurality of even-numbered shift registers ST2E that receive a second start pulse G2VST (EVEN) and the second clocks G2CLK3, G2CLK4 and sequentially output the pulses of the even-numbered scan signals SC22, SC24, and SC26. The pulse width of the second scan signal SC21 to SC26 may be one horizontal period. The first clocks G2CLK1 and G2CLK2 may include two or more shift clocks that with different phases. The second clocks G2CLK3 and G2CLK4 may include two or more shift clocks with different phases. Carry signals may be transmitted between the odd-numbered signal transmission part ST2O and the even-numbered signal transmission part ST2E that are adjacent to each other.

After the pulse of a second-first scan signal SC21 is applied to the first pixel PXL1, the pulse of a second-second scan signal SC22 may be applied to the second pixel PXL2. Subsequently, after the pulse of a second-third scan signal SC23 is applied to the third pixel PXL3, the pulse of a second-fourth scan signal SC24 may be applied to the fourth pixel PXL4. Subsequently, after the pulse of a second-fifth scan signal SC25 is applied to the fifth pixel PXL5, a pulse of a second-sixth scan signal SC26 may be applied to the sixth pixel PXL6.

The third shift register SR3 includes a plurality of signal transmission parts ST3 connected in cascade. The third shift register SR3 receives the start pulse G3VST and the clocks G3CLK1 and G3CLK2 and sequentially outputs the pulse of the third scan signal SC3n. The clocks G3CLK1 and G3CLK2 may include two or more shift clocks with different phases. The third scan signal SC3n may have a pulse width set to be wider than one horizontal period, as shown in FIGS. 11 and 13, and may be applied simultaneously to the pixels 101 disposed on the plurality of pixel lines. For example, a pulse of a third scan signal SC1(n−2) may be applied simultaneously to the first and second pixels PXL1 and PXL2 that are vertically adjacent to each other. Subsequently, a pulse of a third scan signal SC3(n) may be applied simultaneously to the third and fourth pixels PXL3 and PXL4 that are vertically adjacent to each other. Subsequently, a pulse of a third scan signal Sc1(n+2) may be applied simultaneously to the fifth and sixth pixels PXL5 and PXL6 that are vertically adjacent to each other.

The fourth shift register SR4 includes a plurality of signal transmission parts ST4 connected in cascade. The fourth shift register SR4 receives the start pulse E3VST and the clocks ECLK1 and, ECLK2 and sequentially outputs the pulse of the EM signal EMn. The clocks ECLK1 and ECLK2 may include two or more shift clocks with different phases. The EM signal EMn may have a pulse width set to be wider than one horizontal period, as shown in FIGS. 11 and 13, and may be applied simultaneously to the pixels 101 disposed on the plurality of pixel lines. For example, a pulse of an EM signal EM (n−2) may be applied simultaneously to the first and second pixels PXL1 and PXL2 that are vertically adjacent to each other. Subsequently, a pulse of an EM signal EM (n) may be applied simultaneously to the third and fourth pixels PXL3 and PXL4 that are vertically adjacent to each other. Subsequently, a pulse of an EM signal EM (n+2) may be applied simultaneously to the fifth and sixth pixels PXL5, PXL6 that are vertically adjacent to each other.

The pixel circuits shown in FIGS. 9A and 9B require five gate signals SC1n, SC1n-i, SC2n, SC3n, and EMn. In the present disclosure, four shift registers SR1, SR2, SR3, and SR4 are used to output the gate signals SC1n, SC1n-i, SC2n, and EMn, as shown in FIG. 16, thereby allowing the circuit size of the gate driver 120 to be reduced or minimized.

Figure 18:
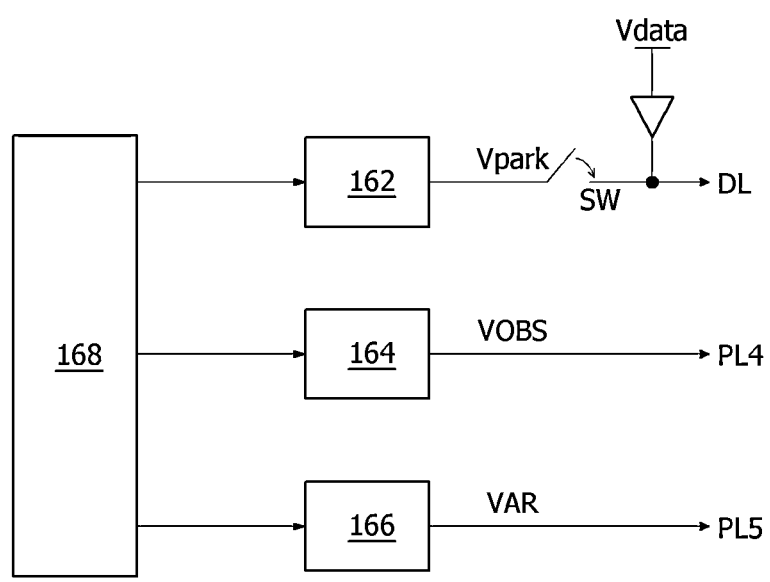
FIG. 18 is a diagram illustrating a compensation voltage generator according to an exemplary embodiment of the present disclosure.

FIG. 18 is a diagram illustrating a compensation voltage generator according to an exemplary embodiment of the present disclosure.

Referring to FIG. 18, the compensation voltage generator 160 includes a voltage control part 168 (e.g., a circuit), a first compensation voltage output part 162 (e.g., a circuit), a second compensation voltage output part 164 (e.g., a circuit), and a third compensation voltage output part 166 (e.g., a circuit).

The voltage control part 168 may determine the frames of the input image and the pixel lines on which the pixel data is written by counting timing signals synchronized with the pixel data of the input image. The timing signal may include one or more of a vertical synchronization signal Vsync, a horizontal synchronization signal Hsync, and a data enable signal DE. The voltage control part 168 outputs voltage data indicating the voltage level of each of the first compensation voltage Vpark, the second compensation voltage VOBS, and the third compensation voltage VAR. The voltage data may be digital data. The voltage of each of the compensation voltages Vpark, VOBS, and VAR may be varied with the voltage data output by the voltage control part 168. For example, the second compensation voltage VOBS may be adjusted to a lower voltage in the refresh frame RF than in the hold frame HF in low power mode, as shown in FIG. 15.

The first compensation voltage output part 162, the second compensation voltage output part 164, and the third compensation voltage output part 166 may each include a digital to analog converter (DAC) that converts the voltage data to a voltage. The first compensation voltage output part 162 converts first voltage data to an analog voltage and outputs the first compensation voltage Vpark. The first compensation voltage Vpark may be applied to the data lines DL through the switch element SW. The switch element SW may be implemented as a transistor that maintains in the off-state during the period of the refresh frame RF period and is turned on during the period of the hold frame HF under the control of the voltage control part 168. The switch element SW may be embedded in an integrated circuit together with the data driver 110 or mounted on the non-display area BZ of the display panel 100.

When the switch element SW is in the off-state, the data voltage Vdata is applied to the data lines DL, while the first compensation voltage Vpark is applied to the data lines DL when the switch element SW is turned on. When the switch element SW is turned on, the data driver 110 does not output the data voltage Vdata.

The second compensation voltage output part 164 converts second voltage data to an analog voltage and outputs the second compensation voltage VOBS to the power line PL4. The third compensation voltage output part 166 converts third voltage data to an analog voltage and outputs the third compensation voltage VAR to the power line PL5.

According to one or more exemplary embodiments of the present disclosure, the display device may be applied to mobile devices, video phones, smart watches, watch phones, wearable device, foldable device, rollable device, bendable device, flexible device, curved device, sliding device, variable device, electronic organizer, electronic books, portable multimedia players (PMPs), personal digital assistants (PDAs), MP3 players, mobile medical devices, desktop PCs, laptop PCs, netbook computers, workstations, navigations, vehicle navigations, vehicle display devices, vehicle devices, theater devices, theater display devices, televisions, wallpaper devices, signage devices, game devices, laptops, monitors, cameras, camcorders, and home appliances, etc. Additionally, the display apparatus according to one or more exemplary embodiments of the present disclosure may be applied to organic light-emitting lighting devices, a quantum dot light-emitting devices, inorganic light-emitting lighting devices, without being limited thereto.

The objects to be achieved by the present disclosure, the means for achieving the objects, and effects of the present disclosure described above do not specify essential features of the claims, and thus, the scope of the claims is not limited to the disclosure of the present disclosure.

Although the exemplary embodiments of the present disclosure have been described in more detail with reference to the accompanying drawings, the present disclosure is not limited thereto and may be embodied in many different forms without departing from the technical concept of the present disclosure. Therefore, the exemplary embodiments disclosed in the present disclosure are provided for illustrative purposes only and are not intended to limit the technical concept of the present disclosure. The scope of the technical concept of the present disclosure is not limited thereto. Therefore, it should be understood that the above-described exemplary embodiments are illustrative in all aspects and do not limit the present disclosure.

What is claimed is:

1. A display device comprising:
   a display panel including a plurality of data lines, a plurality of gate lines, a plurality of power lines, and a plurality of sub-pixels;
   a data driver configured to supply a data voltage to the plurality of data lines; and
   a gate driver configured to supply gate signals to the plurality of gate lines,
   wherein each of the plurality of sub-pixels includes:
      a light-emitting element;
      a driving element including a gate electrode connected to a first node, a first electrode connected to a second node, a second electrode connected to a third node, and the driving element configured to drive the light-emitting element;
      a first switch element configured to supply a pixel driving voltage to the second node;
      a second switch element configured to supply the data voltage to the second node;
      a third switch element configured to connect the first node to the third node; and
      a fourth switch element configured to supply an initialization voltage to the first node; and
   wherein the gate signals include:
      a first-first scan signal applied to a gate electrode of the fourth switch element, a first-second scan signal applied to a gate electrode of the third switch element, a second scan signal applied to a gate electrode of the second switch element, and an emission control signal applied to a gate electrode of the first switch element,
      wherein a pulse of the first-first scan signal has a same pulse width as a pulse of the first-second scan signal and precedes the pulse of the first-second scan signal, and
      wherein a part of the pulse of the first-first scan signal overlap the pulse of the first-second scan signal.

2. The display device of claim 1, wherein the gate driver includes:
   a first shift register configured to output a pulse of the first-first scan signal, followed by a pulse of the first-second scan signal;
   a second shift register configured to output a pulse of the second scan signal; and
   a third shift register configured to output a pulse of the emission control signal.

3. The display device of claim 2, wherein the first shift register includes a plurality of first signal transmission parts connected in cascade;
   wherein the second shift register includes a plurality of second signal transmission parts connected in cascade; and
   wherein the third shift register includes a plurality of third signal transmission parts connected in cascade, and
   wherein start pulses and clocks input to the first shift register to the third shift register have one or more of a phase, a frequency, and a duty ratio that are different from each other.

4. The display device of claim 1, wherein each of the plurality of sub-pixels further includes a capacitor connected between the pixel driving voltage and the first node,
   wherein the first switch element includes a gate electrode to which the emission control signal is applied, a first electrode to which the pixel driving voltage is applied, and a second electrode connected to the second node,
   wherein the second switch element includes a gate electrode to which the second scan signal is applied, a first electrode connected to a data line from the plurality of data lines, and a second electrode connected to the second node;
   wherein the third switch element includes a gate electrode to which the first-second scan signal is applied, a first electrode connected to the first node, and a second electrode connected to the third node,
   wherein the fourth switch element includes a gate electrode to which the first-first scan signal is applied, a first electrode connected to the first node, and a second electrode to which the initialization voltage is applied; and
   wherein the light-emitting element includes an anode electrode connected to the third node and a cathode electrode to which a cathode voltage is applied.

5. The display device of claim 4, wherein during an initialization period, the third switch element and the fourth switch element are configured to be turned on and apply the initialization voltage to the first node and the third node,
   wherein during a sampling period, the second switch element and the third switch element are configured to be turned on and the data voltage is applied to the second node and the first node is electrically connected to the third node, and
   wherein during an emission period, the first switch element is configured to be turned on.

6. The display device of claim 5, wherein during the sampling period, the second switch element and the third switch element are configured to apply the data voltage to the first node and the third node through the driving element in an on-state.

7. The display device of claim 1, wherein each of the plurality of sub-pixels further includes:
   a fifth switch element configured to supply a second compensation voltage to the second node;
   a sixth switch element configured to apply a third compensation voltage to a fourth node; and
   a seventh switch element configured to connect the third node to the fourth node in response to the emission control signal, and
   wherein the gate signals further include a third scan signal applied to the gate electrode of each of the fifth switch element and the sixth switch element.

8. The display device of claim 7, wherein each of the plurality of sub-pixels further includes:
   a first capacitor connected between the pixel driving voltage and the first node,
   the first switch element includes a gate electrode to which the emission control signal is applied, a first electrode to which the pixel driving voltage is applied, and a second electrode connected to the second node,
   the second switch element includes a gate electrode to which the second scan signal is applied, a first electrode connected to a data line from the plurality of data lines, and a second electrode connected to the second node, the third switch element includes a gate electrode to which the first-second scan signal is applied, a first electrode connected to the first node, and a second electrode connected to the third node, the fourth switch element includes a gate electrode to which the first-first scan signal is applied, a first electrode connected to the first node, and a second electrode to which the initialization voltage is applied;

the fifth switch element includes a gate electrode to which the third scan signal is applied, a first electrode connected to the second node, and a second electrode to which the second compensation voltage is applied, the sixth switch element includes a gate electrode to which the third scan signal is applied, a first electrode connected to the fourth node, and a second electrode to which the third compensation voltage is applied, the seventh switch element includes a gate electrode to which the emission control signal is applied, a first electrode connected to the third node, and a second electrode connected to the fourth node, and the light-emitting element includes an anode electrode connected to the fourth node and a cathode electrode to which a cathode voltage is applied.

9. The display device of claim 8, wherein a low power mode includes a refresh frame in which a data voltage is applied to the plurality of sub-pixels through the data line, and a hold frame in which a first compensation voltage is applied to the plurality of sub-pixels through the data line, wherein the refresh frame includes a first on-bias period, a first initialization period, a second initialization period, a sampling period, a second on-bias period, and an emission period, wherein during the first on-bias period of the refresh frame, the fifth switch element and the sixth switch element are configured to be turned on and apply the second compensation voltage to the second node and the third compensation voltage to the fourth node, wherein during the first initialization period of the refresh frame, the fourth switch element is configured to be turned on and apply the initialization voltage to the first node, wherein during the second initialization period of the refresh frame, the third switch element and the fourth switch element are configured to be turned on and apply the initialization voltage to the first node and the third node, wherein during the sampling period of the refresh frame, the second switch element is configured to be turned on and apply the data voltage to the second node, wherein during the second on-bias period of the refresh frame, the fifth switch element and the sixth switch element are configured to be turned on and apply the second compensation voltage to the second node and the third compensation voltage to the fourth node, and wherein during the emission period of the refresh frame, the first switch element and the seventh switch element are configured to be turned on.

10. The display device of claim 9, wherein during the sampling period of the refresh frame, the second switch element and the third switch element are configured to apply the data voltage to the first node and the third node through the driving element in an on-state.

11. The display device of claim 9, further comprising:
a switch element configured to apply the first compensation voltage to the data line during the hold frame, wherein no data voltage is output from the data driver in the hold frame.

12. The display device of claim 9, wherein the hold frame includes a third on-bias period, a fourth on-bias period, and an emission period, wherein during each of the third on-bias period and the fourth on-bias period of the hold frame, the fifth switch element and the sixth switch element are configured to be turned on and apply the second compensation voltage to the second node and the third compensation voltage to the fourth node, and the first switch element and the seventh switch element are configured to be turned on during the emission period of the hold frame.

13. The display device of claim 12, wherein the refresh frame further includes a first floating period between the first on-bias period and the first initialization period, a second floating period between the sampling period and the second on-bias period, and a third floating period between the second on-bias period and the emission period of the refresh frame, wherein the hold frame further includes a fourth floating period between the third on-bias period and the fourth on-bias period, and a fifth floating period between the fourth on-bias period and the emission period of the hold frame, and wherein the first switch element to the seventh switch element are in an off-state in each of the first floating period to the fifth floating period.

14. The display device of claim 9, wherein the second compensation voltage is less in the refresh frame than in the hold frame.

15. The display device of claim 7, wherein each of the plurality of sub-pixels further includes a second capacitor connected between a gate line, to which the third scan signal is applied, and the first node.

16. The display device of claim 7, wherein the gate driver includes:
a first shift register configured to output a pulse of the first-first scan signal, followed by a pulse of the first-second scan signal;
a second shift register configured to output a pulse of the second scan signal;
a third shift register configured to output a pulse of the third scan signal; and
a fourth shift register configured to output a pulse of the emission control signal.

17. The display device of claim 16, wherein the second shift register includes:
a plurality of odd-numbered signal transmission parts configured to sequentially output pulses of odd-numbered scan signals; and
a plurality of even-numbered signal transmission parts configured to sequentially output pulses of even-numbered scan signals, and
wherein a carry signal is transmitted between the plurality of odd-numbered signal transmission parts and the plurality of even-numbered signal transmission parts, which are adjacent to each other.

18. A method of driving a display device comprising:
supplying a gate signal to a plurality of gate lines connected to a pixel circuit during a refresh frame period and a hold frame period;
supplying a data voltage to a plurality of data lines, and supplying the data voltage, a second compensation voltage, and a third compensation voltage to the pixel circuit during the refresh frame period; and supplying a first compensation voltage to the plurality of data lines, and supplying the first compensation voltage, the second compensation voltage, and the third compensation voltage to the pixel circuit during the hold frame period, wherein the gate signal includes:

pulses of a first-first scan signal and a first-second scan signal sequentially output from a first shift register, a pulse of a second scan signal sequentially output from a second shift register, and a pulse of an emission control signal sequentially output from a third shift register, wherein the pulse of the first-first scan signal is generated and then the pulse of the first-second scan signal is generated, and the pulse of the first-first scan signal has a same pulse width as the pulse of the first-second scan signal and precedes the pulse of the first-second scan signal.

19. A method of driving a display device comprising:

supplying a gate signal to a plurality of gate lines connected to a pixel circuit during a refresh frame period and a hold frame period;

supplying a data voltage to a plurality of data lines, and supplying the data voltage, a second compensation voltage, and a third compensation voltage to the pixel circuit during the refresh frame period; and supplying a first compensation voltage to the plurality of data lines, and supplying the first compensation voltage, the second compensation voltage, and the third compensation voltage to the pixel circuit during the hold frame period, wherein the gate signal includes:

pulses of a first-first scan signal and a first-second scan signal sequentially output from a first shift register, a pulse of a second scan signal sequentially output from a second shift register, a pulse of a third scan signal sequentially output from a third shift register, and a pulse of an emission control signal sequentially output from a fourth shift register, and wherein the pulse of the first-first scan signal is generated and then the pulse of the first-second scan signal is generated, and the pulse of the first-first scan signal has a same pulse width as the pulse of the first-second scan signal and precedes the pulse of the first-second scan signal.

20. The method of claim 19, wherein some period of the pulse of the first-first scan signal overlap the pulse of the first-second scan signal.

* * * * *